United States Patent
Tsukuda et al.

(10) Patent No.: US 7,838,926 B2
(45) Date of Patent: Nov. 23, 2010

(54) SEMICONDUCTOR DEVICE

(75) Inventors: Masanori Tsukuda, Kawasaki (JP);
Ichiro Omura, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 12/368,573

(22) Filed: Feb. 10, 2009

(65) Prior Publication Data
US 2009/0206365 A1    Aug. 20, 2009

(30) Foreign Application Priority Data
Feb. 15, 2008   (JP) .............................. P2008-35217
May 15, 2008   (JP) .............................. P2008-127962

(51) Int. Cl.
*H01L 29/78* (2006.01)
(52) U.S. Cl. .............................. 257/329; 257/E29.005; 257/E29.066
(58) Field of Classification Search ................ 257/329, 257/E29.005, E29.066
See application file for complete search history.

(56) References Cited

U.S. PATENT DOCUMENTS

| 6,037,632 A | 3/2000 | Omura et al. |
| 7,132,321 B2 | 11/2006 | Kub et al. |

FOREIGN PATENT DOCUMENTS

| JP | 6-61495 | 3/1994 |
| JP | 2002-43573 | 2/2002 |
| JP | 2004-103982 | 4/2004 |

OTHER PUBLICATIONS

Masanori Tsukuda, et al., "Critical IGBT Design Regarding EMI and Switching Losses", Proceedings of the 20$^{th}$ International Symposium on Power Semiconductor Devices & IC's, May, 2008, pp. 185-188.
H.P. Felsl, et al., "The CIBH Diode—Great Improvement for Ruggedness and Softness of High Voltage Diodes", Proceedings of the 20$^{th}$ International Symposium on Power Semiconductor Devices & IC's, May, 2008, pp. 173-176.

*Primary Examiner*—Victor A Mandala
*Assistant Examiner*—Fei Fei Yeung Lopez
(74) *Attorney, Agent, or Firm*—Oblon, Spivak, McClelland, Maier & Neustadt, L.L.P.

(57) ABSTRACT

A semiconductor device includes a semiconductor substrate; a first base region of a first conductivity type provided in the semiconductor substrate; a buffer region of the first conductivity type provided on a lower surface of the first base region and having an impurity concentration higher than an impurity concentration of the first base region; an emitter region of a second conductivity type provided on a lower surface of the buffer region; a second base region of the second conductivity type selectively provided on an upper surface of the first base region; a diffusion region of the first conductivity type selectively provided on an upper surface of the second base region; a control electrode; a first main electrode; and a second main electrode. A junction interface between the buffer region and the first base region has a concave portion and a convex portion.

13 Claims, 21 Drawing Sheets

ELEMENT REGION ⟵ ⋮ ⟶ TERMINAL REGION

ELEMENT REGION ⟵ ⋮ ⟶ TERMINAL REGION

SEMICONDUCTOR DEVICE

CROSS REFERENCE TO RELATED APPLICATIONS

This application is based on and claims the benefit of priority from prior Japanese Patent Applications No. 2008-35217, filed on Feb. 15, 2008, and No. 2008-127962 filed on May 15, 2008, the entire contents of which are incorporated herein by reference.

BACKGROUND OF THE INVENTION

1. Field of the Invention

The present invention relates to a semiconductor device. More specifically, the present invention relates to a semiconductor device such as an IGBT (Insulated Gate Bipolar Transistor).

2. Description of the Related Art

A semiconductor device such as the IGBT or a MOSFET (Metal Oxide Semiconductor Field Effect Transistor) has high speed switching characteristic and a reverse blocking voltage (breakdown voltage) of several tens to several hundreds of volts and is widely used for power conversion and control in a home electric device, a communication device, an on-vehicle motor or the like. To realize downsizing, efficiency improvement and lower power consumption of a power supply system using such a semiconductor device, it is necessary to reduce a resistance during an on-operation and a power loss during turn off of the IGBT or the like included in the system keeping high breakdown voltage. Various configurations are known for reducing an on-resistance and turn-off power loss of the IGBT and reducing a turn-off loss of the IGBT (see, for example, Japanese Patent Application Laid-Open Nos. 2002-43573 and 2004-103982).

During an off-operation of the IGBT, carriers accumulated in an n− base region in a conductive state are emitted. At this time, a collector-emitter voltage rises and a depletion layer extends from a junction interface between a p type base region and the n− type base region, accordingly. If an n+ type buffer region is formed uniformly to have a uniform depth as disclosed in the Japanese Patent Application Laid-Open Nos. 2002-43573 and 2004-103982, the depletion layer extending from the junction interface between the p type base region and the n− type base region reaches an entire surface of the n+ type buffer region simultaneously. At this time, the carriers accumulated in the n− type base region are completely emitted, with the result that supply of a current suddenly stops and noise is disadvantageously generated.

SUMMARY OF THE INVENTION

According to one aspect of the present invention, there is provided a semiconductor device including: a semiconductor substrate having an upper surface and a lower surface opposed to each other; a first base region of a first conductivity type provided in the semiconductor substrate; a buffer region of the first conductivity type provided on a lower surface of the first base region and having an impurity concentration higher than an impurity concentration of the first base region; an emitter region of a second conductivity type provided on a lower surface of the buffer region; a second base region of the second conductivity type selectively provided on an upper surface of the first base region; a diffusion region of the first conductivity type selectively provided on an upper surface of the second base region; a control electrode provided in a region ranging from the diffusion region to the first base region via the second base region, with an insulating film therearound; a first main electrode provided to be electrically connected to the second base region and the diffusion region; and a second main electrode provided to be electrically connected to a lower surface of the emitter region, a junction interface between the buffer region and the first base region having a concave portion and a convex portion.

According to another aspect of the present invention, there is provided a semiconductor device including: a semiconductor substrate having an upper surface and a lower surface opposed to each other; a first base region of a first conductivity type provided in the semiconductor substrate and having a first impurity concentration; a buffer region of the first conductivity type provided on a lower surface of the first base region and having a second impurity concentration higher than the first impurity concentration; an emitter region of a second conductivity type provided on a lower surface of the buffer region; a second base region of the second conductivity type selectively provided on an upper surface of the first base region; a diffusion region of the first conductivity type selectively provided on an upper surface of the second base region; a control electrode provided in a region ranging from the diffusion region to the first base region via the second base region, with an insulating film therearound; a first main electrode provided to be electrically connected to the second base region and the diffusion region; and a second main electrode provided to be electrically connected to a lower surface of the emitter region, a high concentration diffusion region of the first conductivity type having a third impurity concentration higher than the first impurity concentration being present in the first base region.

According to yet another aspect of the present invention, there is provided a semiconductor device including: a semiconductor substrate having an upper surface and a lower surface opposed to each other; a first semiconductor region of a first conductivity type provided in the semiconductor substrate and having a first impurity concentration; an emitter region of the first conductivity type provided on a lower surface of the first semiconductor region and having a second impurity concentration higher than the first impurity concentration; an emitter region of a second conductivity type provided on an upper surface of the first semiconductor region and having a third impurity concentration; a first main electrode provided to be electrically connected to the emitter region of the first conductivity type; and a second main electrode provided to be electrically connected to the emitter region of the second conductivity type, a diffusion region of the first conductivity type having a fourth impurity concentration higher than the first impurity concentration being present in the first semiconductor region, and a diffusion region of the second conductivity type having a fifth impurity concentration higher than the third impurity concentration being present closer to a surface of the emitter region of the first conductivity type than the diffusion region of the first conductivity type present in the first semiconductor region.

DETAILED DESCRIPTION OF THE EMBODIMENTS

First Embodiment

Embodiments of the present invention will be described hereinafter in detail with reference to the accompanying drawings. The embodiments will be described assuming that a first conductivity type is an n type and a second conductivity type is a p type. Further, "n+ type" refers to a semiconductor of the n type having a high impurity concentration and "n− type" refers to a semiconductor of the n type having a low impurity concentration. Likewise, "p+ type" refers to a semiconductor of the p type having a high impurity concentration and "p− type" refers to a semiconductor of the p type having a low impurity concentration.

Figure 1:
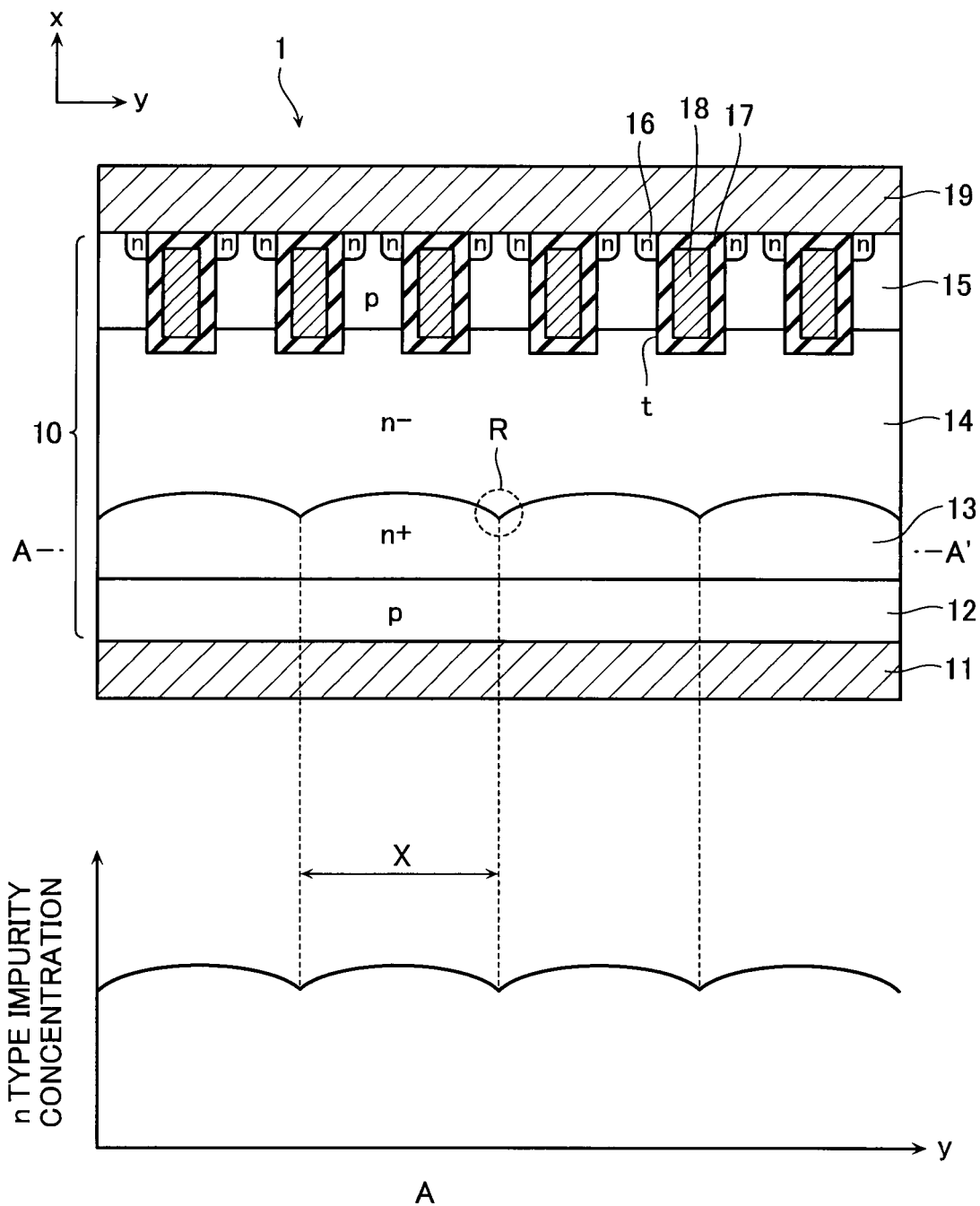
FIG. 1 is a cross-sectional view typically showing a configuration of a semiconductor device according to a first embodiment of the present invention.

The upper part of FIG. 1 is a cross-sectional view typically showing a configuration of a semiconductor device according to a first embodiment of the present invention. The lower part of FIG. 1 is a graph showing an n type impurity concentration in an n+ type buffer region. The semiconductor device 1 according to this embodiment is a trench gate IGBT. The semiconductor device 1 includes an upper surface and a lower surface opposed to each other and is formed on a semiconductor substrate 10 made of, for example, silicon (Si). A thickness of the semiconductor substrate 10 according to this embodiment is, for example, 50 to 120 μm.

An n− type base region 14 is provided in the semiconductor substrate 10. An impurity concentration of the n− type base region 14 is, for example, $6E13$ atom/cm$^3$. A p type base region 15 connected to the n− type base region 14 is selectively provided on an upper surface of the n− type base region 14. Furthermore, n type source regions 16 are selectively provided on an upper surface of the p type base region 15.

Trenches t are formed in a region ranging from the n type source regions 16 to the n− type base region 14 through the p type base region 15. A gate electrode 18 is provided in each of the trenches t with a gate insulating film 17 therearound. The gate insulating film 17 is a silicon oxide film having a thickness of, for example, about 0.1 μm. By applying a gate voltage equal to or higher than a threshold voltage to this gate electrode 18, the gate electrode 18 forms a channel extending in a direction perpendicular to the semiconductor substrate (an x direction shown in FIG. 1) 10 in the p type base region 15 to make the IGBT conductive.

An emitter electrode 19 is provided on upper surfaces of the p type base region 15 and the n type source regions 16 so as to be connected to the n type source regions 16 and to be electrically connected to the n− type base region 14 via the p type base region 15. The emitter electrode 19 is isolated from the gate electrode 18 by the gate insulating film 17. An n+ type buffer region 13 having a higher impurity concentration than an impurity concentration of the n− type base region 14 is provided on a lower surface of the n− type base region 14. The impurity concentration of the n+ type buffer region 13 is, for example, 5E15 atom/cm$^3$. A p type emitter region 12 is provided on a lower surface of the n+ buffer region 13 and a collector electrode 11 is provided to be electrically connected to the p type emitter region 12.

As shown in FIG. 1, a cross section of a junction between the n+ type buffer region 13 and the n− type base region 14 of the semiconductor device 1 according to this embodiment is formed so that curves each having an upward convex are connected in a lateral direction along an upper surface of the semiconductor substrate 10 (a y direction shown in FIG. 1). In this embodiment, this cross-sectional shape of the junction continues in stripes in a direction perpendicular to the sheet in FIG. 1. Thus, the junction interface between the n− type base region 14 and the n+ type buffer region 13 of the semiconductor device 1 is formed to have concave and convex portions.

The graph shown in the lower part of FIG. 1 is a graph of a distribution of n type impurity concentrations at the same depth of the n+ type buffer region 13 (portions taken along the line A-A' in the configuration diagram shown in the upper part of FIG. 1) shown in association with a structure of the IGBT shown in the upper part of FIG. 1. The distribution of the n type impurity concentrations of the n+ type buffer region 13 of the semiconductor device 1 according to this embodiment is a distribution in which an impurity concentration periodically changes at the same depth. A peak of the impurity concentration is formed at a position corresponding to a portion in which a peak of each convex portion of the n+ type buffer region 13 is formed. The impurity concentration periodically changes at the same width as a width X of a repetition unit of one concave portion and one convex portion of the n+ type buffer region 13.

An on-operation of the semiconductor device 1 according to this embodiment configured as described above will be described. It is assumed that the n type source regions 16 are grounded via the emitter electrode 19 during the on-operation. In this state, the voltage equal to or higher than the threshold voltage is applied to the gate electrode 18, thereby generating a potential difference between the gate electrode 18 and the n type source regions 16. Then, a channel is formed in a portion of the p type base region 15 along each gate insulating film 17. Electrons are injected from this channel into the n− type base region 14 and current flows from the collector electrode 11 to the emitter electrode 19. At this time, holes that are carriers are injected into the n− type base region 14 from the p type emitter region 12 via the n+ type buffer region 13 in response to electron injection. Consequently, a conductivity modulation occurs and an on-resistance of the IGBT is reduced.

An off-operation of the semiconductor device 1 according to this embodiment will be described. During the off-operation, carriers accumulated in the n− type base region 14 are emitted toward the n+ type buffer region 13. At this time, a collector-emitter voltage rises and a depletion layer extends from a junction interface between the p type base region 15 and the n− type base region 14 with the voltage rise.

As shown in the Japanese Patent Application Laid-Open Nos. 2002-43573 and 2004-103982, if the junction interface between the n+ type buffer region 13 and the n− type base region 14 is formed flat, the depletion layer extending from the junction interface between the p type base region 15 and the n− type base region 14 reaches the entire surface of the n+ type buffer region 13 simultaneously. At this time, the carriers accumulated in the n− type base region 14 are completely emitted and supply of current stops suddenly. As a voltage V is represented by a temporal change of a current I (V=Ls(dI/dt), where Ls is a parasitic inductance of a circuit), noise is disadvantageously generated due to a voltage generated by a sudden change of the current.

During the off-operation of the semiconductor device 1 according to this embodiment, vertex portions of the n+ type buffer region 13 formed to have concave and convex portions prevent spread of the depletion layer extending from the emitter electrode 19 side. At this time, regions R in valleys between peaks of the n+ type buffer region 13 formed in semicircles remain without being depleted. Carriers remaining in a region R of a valley between peaks of the n+ type buffer region 13 are not emitted suddenly but gently by the depletion layer. Consequently, even after the depletion layer reaches the n+ type buffer region 13, the carriers are emitted gradually and the current does not stop suddenly. Accordingly, the voltage represented by the temporal change of the current does not rise suddenly, and noise is reduced.

An example of a method of manufacturing the semiconductor device 1 shown in FIG. 1 will next be described with reference to FIGS. 2 to 6. FIGS. 2 to 6 are process diagrams showing manufacturing processes of the semiconductor device 1 according to the first embodiment. In the processes of manufacturing the semiconductor device 1 shown in FIGS. 2 to 6, the emitter electrode 19 side is shown on the lower side of the sheet in each of FIGS. 2 to 6 and the collector electrode 11 side is shown on the upper side thereof, that is, the semiconductor substrate 10 is shown upside-down in FIGS. 2 to 6.

Figure 2:
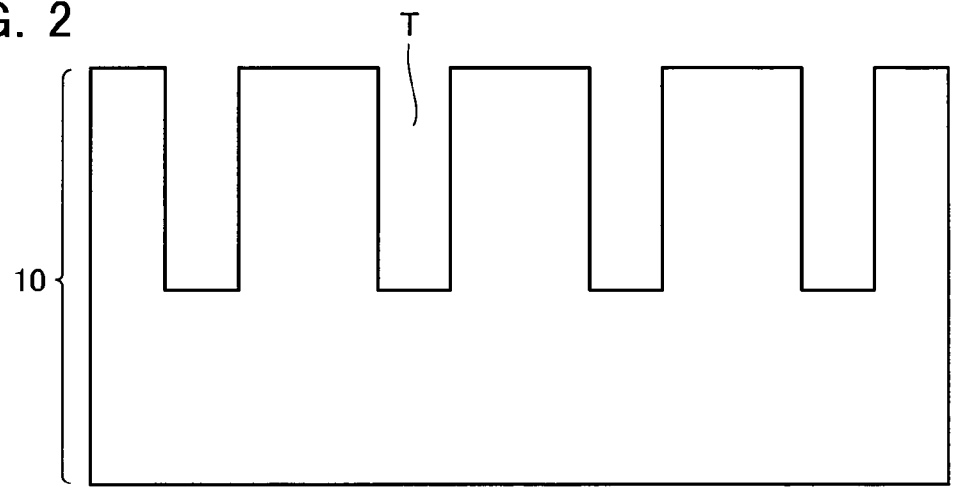
FIG. 2 is a process diagram showing a manufacturing process of the semiconductor device according to the first embodiment.
Figure 3:
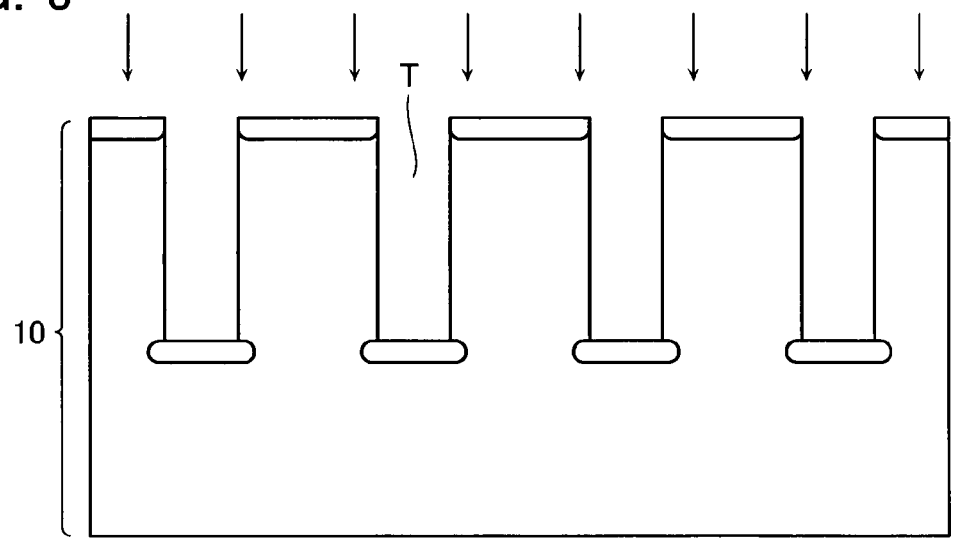
FIG. 3 is a process diagram showing a manufacturing process of the semiconductor device according to the first embodiment.

As shown in FIG. 2, trenches T are formed in certain regions of the semiconductor substrate 10, respectively. In this embodiment, a thickness of the semiconductor substrate 10 is, for example, about 200 μm, a depth of each trench T is, for example, 120 μm and a distance between the two trenches T is, for example, 30 μm. It is assumed that the trenches T continue in stripes in a direction perpendicular to the sheet. Next, as shown in FIG. 3, n type impurity, e.g., arsenic (As) ions are implanted into the entire surface of the semiconductor substrate 10 in which the trenches T are formed using an ion implantation device. In this embodiment, a dose amount of the ions implanted into the semiconductor substrate 10 is set to, for example, 1E12 to 3E13 atom/cm$^2$.

Figure 4:
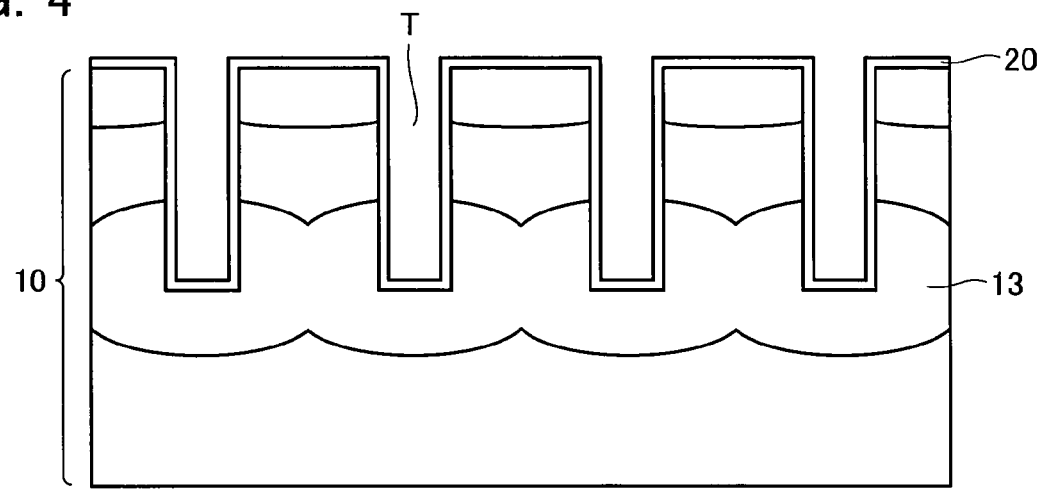
FIG. 4 is a process diagram showing a manufacturing process of the semiconductor device according to the first embodiment.

As shown in FIG. 4, n type impurities are diffused by conducting, for example, a heat treatment on the semiconductor substrate 10. The n type impurities implanted into bottoms of the trenches T bind together to form the n+ type buffer region 13 in the semiconductor substrate 10. In this case, the n type impurities implanted into the bottoms of the trenches T are separated from one another by an opening pitch of the trenches T. Due to this, the n+ type buffer region 13 formed by diffusion of the n type impurities can be formed to have a semicircular cross section. In this embodiment, the shape and the impurity concentration of the n+ type buffer region 13 can be adjusted according to the width and depth of the trenches T and the n type impurities implanted into the trenches T. Thereafter, a protection film 20 is formed on an entire surface of the semiconductor substrate 10 in which the trenches T are formed.

Figure 5:
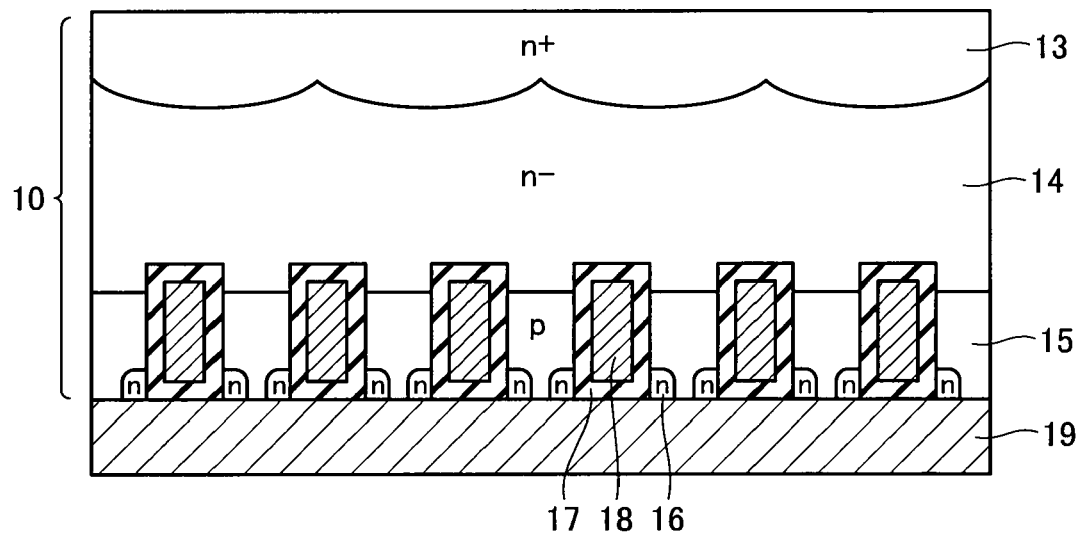
FIG. 5 is a process diagram showing a manufacturing process of the semiconductor device according to the first embodiment.

As shown in FIG. 5, the p type base region 15, the n type source regions 16, the trench gate electrodes 18 and the emitter electrode 19 are formed on the semiconductor substrate 10 by a well-known IGBT manufacturing process. At this time, a structure such as a guard ring region may be formed in a terminal region of the semiconductor device that is not shown. The surface of the semiconductor substrate 10 in which the trenches T are formed is ground to eliminate the protection film 20 on the bottoms of the trenches T and thereby flattened. In this embodiment, the surface of the semiconductor substrate 10 is ground until the thickness of the semiconductor substrate 10 becomes, for example, about 50 to 80 μm.

Figure 6:
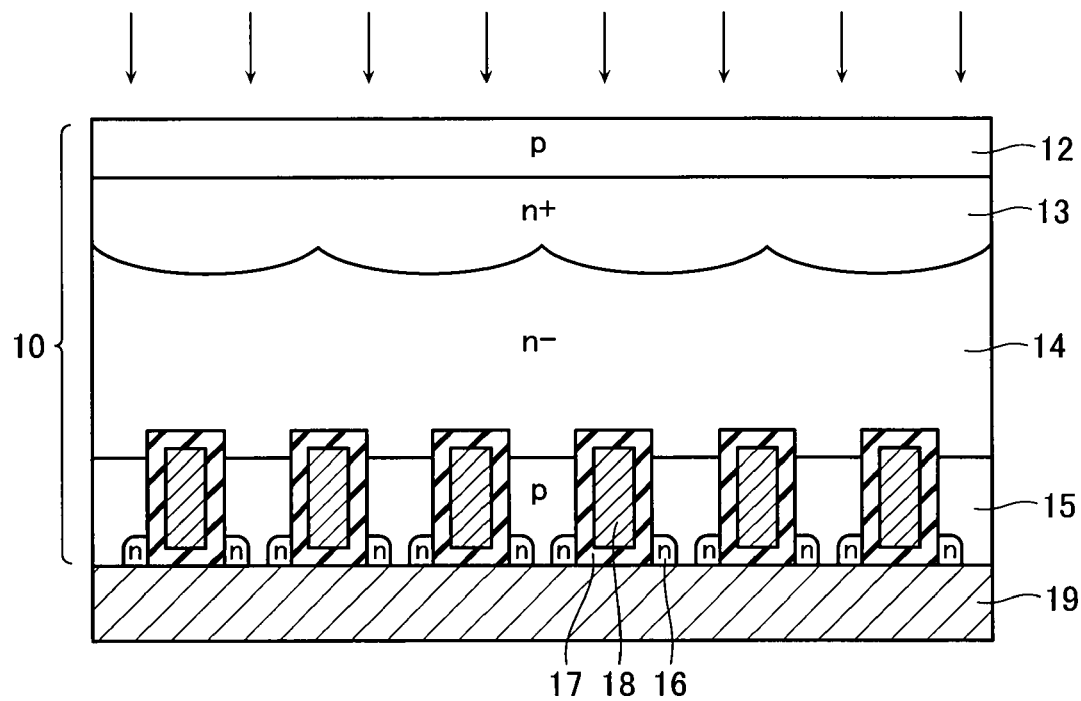
FIG. 6 is a process diagram showing a manufacturing process of the semiconductor device according to the first embodiment.

As shown in FIG. 6, p type impurity, e.g., boron (B) ions are implanted into the flattened surface at a dose amount of 1E13 to 1E14 atom/cm$^2$ and activated, thereby forming the p type emitter region 12. A conductor is deposited on the p type emitter region 12 thus formed, thereby forming the collector electrode 11. As a consequence, the semiconductor device 1 shown in FIG. 1 can be obtained.

With the method of manufacturing the semiconductor device 1 according to the first embodiment, the n+ type buffer region 13 can be formed by thermally diffusing the n type impurities before the IGBT structure is formed on the surface of the semiconductor substrate 10. Since there is no need to heat the semiconductor substrate 10 after forming the surface structure, the p type base region 15, the n type source regions 16 and the like formed in the surface of the semiconductor substrate 1 are not influenced by heat. Furthermore, the surface structure is formed in a state where the thickness of the semiconductor substrate 10 remains as thick as 200 μm and then ground, which can facilitate performing various processes such as transport and processing for forming the surface structure.

A method of manufacturing the semiconductor device according to a modification of the first embodiment of the present invention will next be described with reference to FIGS. 7 to 9. In the manufacturing method according to the modification, processes before and including the ion implantation shown in FIG. 3 are similar to those described above.

Figure 7:
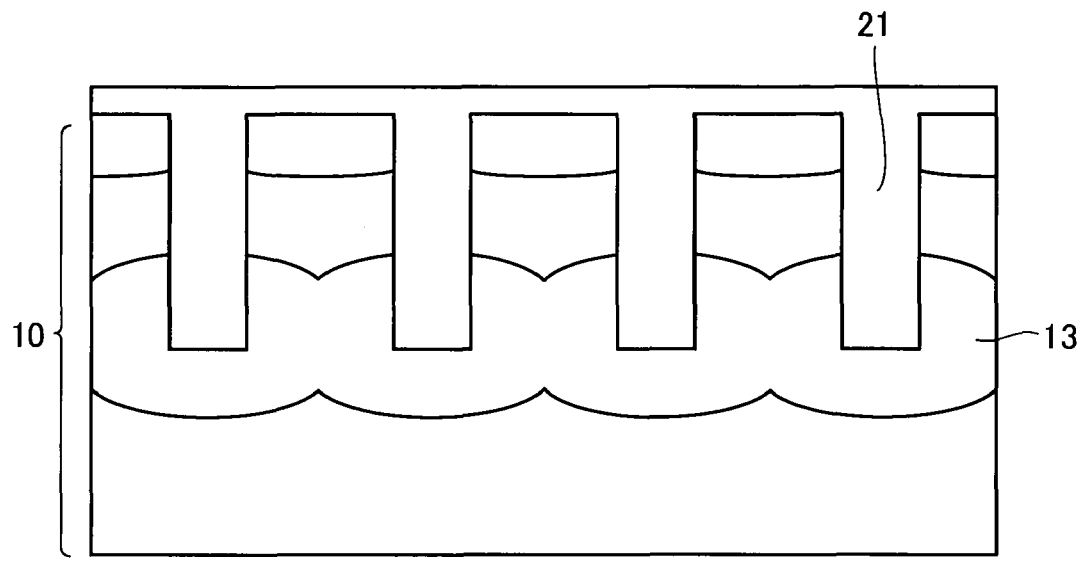
FIG. 7 is a process diagram showing a manufacturing process of the semiconductor device according to a modification of the first embodiment.

As shown in FIG. 7, n type impurities are diffused by conducting, for example, a heat treatment on the semiconductor substrate 10. The n type impurities implanted into the bottoms of the trenches T bind together to form an n+ buffer region 13 in the semiconductor substrate 10. The n type impurities implanted into the bottoms of the trenches T are separated from one another by the opening pitch of the trenches T. Due to this, the n+ buffer region 13 formed by diffusion of the n type impurities can be formed to have a semicircular cross section. Thereafter, a filled material, e.g., polysilicon 21 is deposited on the entire surface of the semiconductor substrate 10 in which the trenches T are formed. The polysilicon 21 is also deposited into the trenches T to fill the trenches T.

Figure 8:
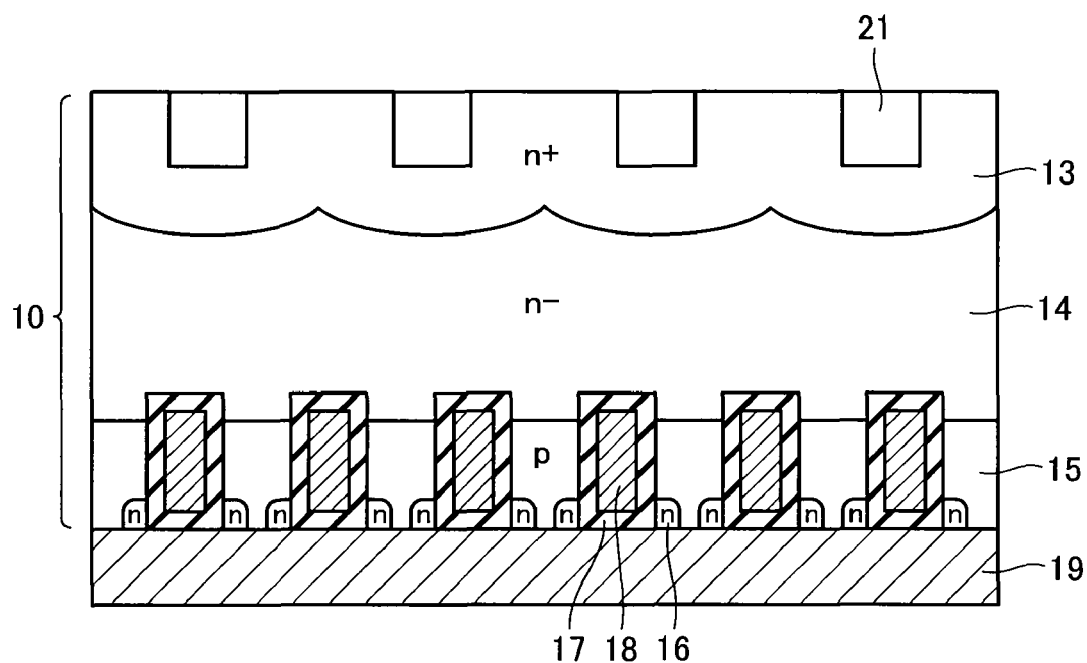
FIG. 8 is a process diagram showing a manufacturing process of the semiconductor device according to the modification of the first embodiment.

Next, as shown in FIG. 8, the p type base regions 15, the n type source regions 16, the trench gate electrodes 18 and the emitter electrode 19 are formed on the semiconductor substrate 10 by a well-known IGBT manufacturing process. At this time, a structure such as a guard ring region may be formed in the terminal region of the semiconductor device that is not shown. Then, the surface of the semiconductor substrate 10 in which the trenches T are formed is ground and thereby flattened. The surface of the semiconductor substrate 10 may be ground either to the extent that the polysilicon 21 filled into the trenches T is left or to the extent that the polysilicon 21 filled into the trenches T is removed. In this modification, the surface of the semiconductor substrate 10 is ground until the thickness of the semiconductor substrate 10 becomes, for example, about 50 to 120 μm while the polysilicon 21 filled into the trenches T is partially left.

Figure 9:
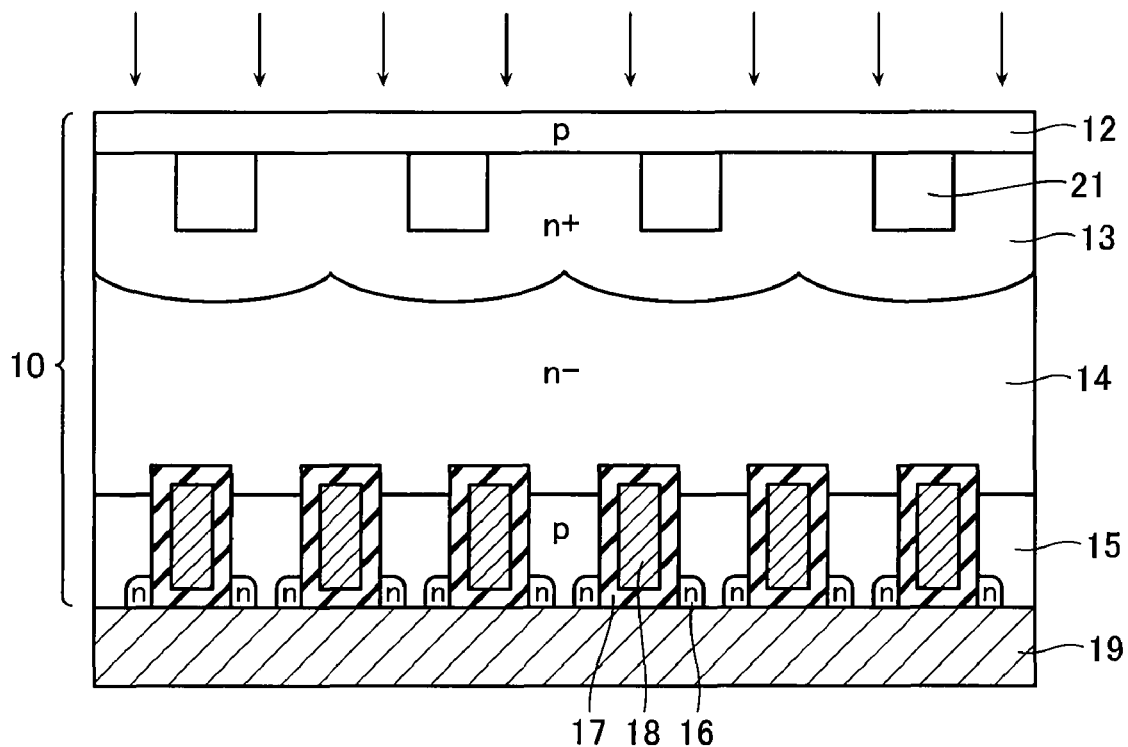
FIG. 9 is a process diagram showing a manufacturing process of the semiconductor device according to the modification of the first embodiment.

Next, as shown in FIG. 9, p type impurity, e.g., boron (B) ions are implanted into the flattened surface at a dose amount of 1E13 to 1E14 atom/cm$^2$ and activated, thereby forming the p type emitter region 12. A conductor is deposited on the p type emitter region 12 thus formed, thereby forming the collector electrode 11. In this way, it is also possible to obtain the semiconductor device 1 having concave and convex portions on the junction interface between the n+ type buffer region 13 and the n− type base region 14. In this modification, since the trenches T are filled with the polysilicon 21, the n type impurity concentration of the n+ type buffer region 13 differs from that shown in the graph shown in FIG. 1.

With the method of manufacturing the semiconductor device 1 according to the modification of the first embodiment, in forming the IGBT structure on the surface of the semiconductor substrate 10, the trenches T are filled with the polysilicon 21. Therefore, it is possible to prevent invasion of dust into the trenches T during formation of the surface structure. Moreover, the surface of the semiconductor substrate 10 in which the trenches T are formed can be ground and flattened uniformly.

Second Embodiment

Figure 10:
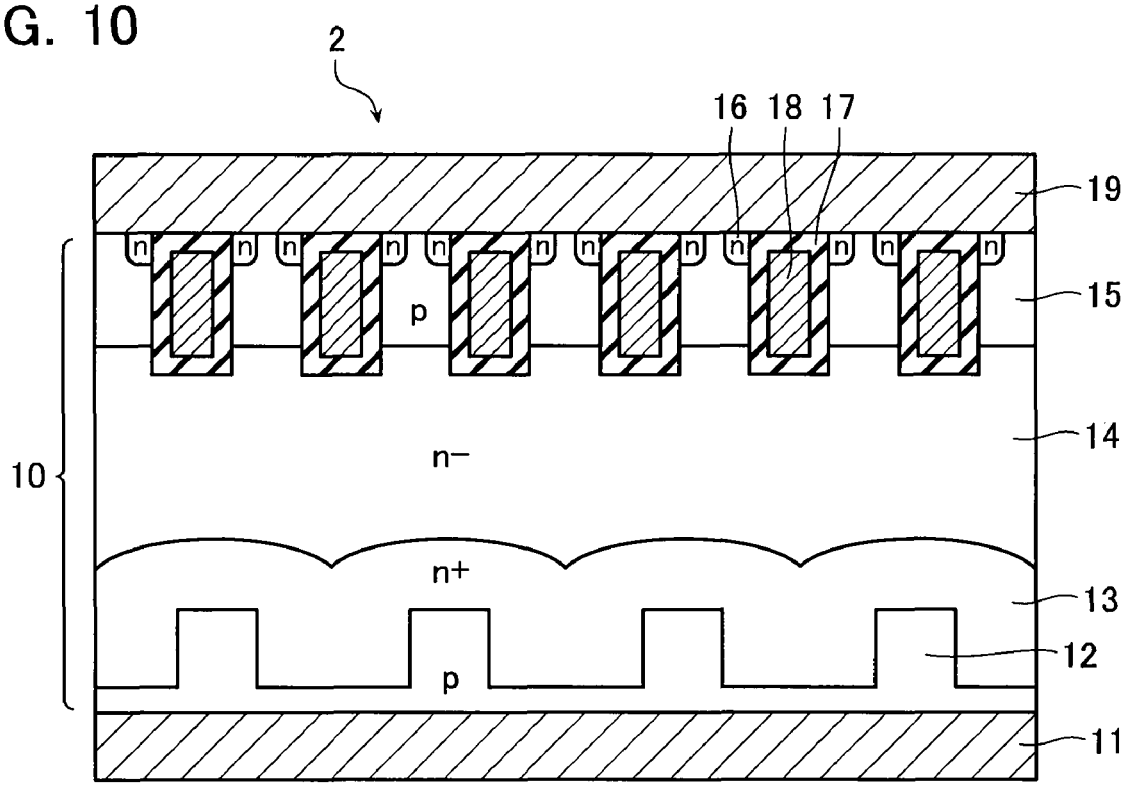
FIG. 10 is a cross-sectional view typically showing a configuration of a semiconductor device according to a second embodiment of the present invention.

FIG. 10 is a cross-sectional view typically showing a configuration of a semiconductor device according to a second embodiment of the present invention. Similar constituent elements of the semiconductor device 2 according to the second embodiment to those according to the first embodiment are assigned with the same reference symbols and the description thereof will be omitted.

As shown in FIG. 10, in the semiconductor device 2 according to the second embodiment, a junction interface between an n+ type buffer region 13 and a p type emitter region 12 is also formed to have concave and convex portions. The p type emitter region 12 of the semiconductor device 2 according to this embodiment shown in FIG. 10 has convex portions formed at positions substantially identical to positions of semicircular peaks of the n+ type buffer region 13, respectively. In this embodiment, the convex portions continue in stripes in a direction perpendicular to the sheet in FIG. 10 similarly to the semicircles of the n+ type buffer region 13. The junction interface between the n+ type buffer region 13 and the p type emitter region 12 is thus formed to have concave and convex portions. In this case, the concave and convex portions of the junction interface between the n+ type buffer region 13 and the p type emitter region 12 may be identical in shape to the concave and convex portions of the junction interface between the n+ type buffer region 13 and the n− type base region 14.

By structuring the p type emitter region 12 as described above, carriers accumulated in the n− type base region 14 during an on-operation varies slightly from place to place. Because of the different concentrations of the carriers, a fast spreading part and a slowly spreading part repeatedly appear in a depletion layer formed during an off-operation. Consequently, the time at which the depletion layer reaches the n+ type buffer region varies among the parts of the depletion layer, thereby making it possible to suppress a phenomenon that a collector current is suddenly cut off and noise is thus generated.

Next, an example of a method of manufacturing the semiconductor device 2 according to the second embodiment will be described with reference to FIGS. 11 to 13. In the manufacturing method according to this embodiment, processes before and including the ion implantation are similar to those according to the first embodiment.

Figure 11:
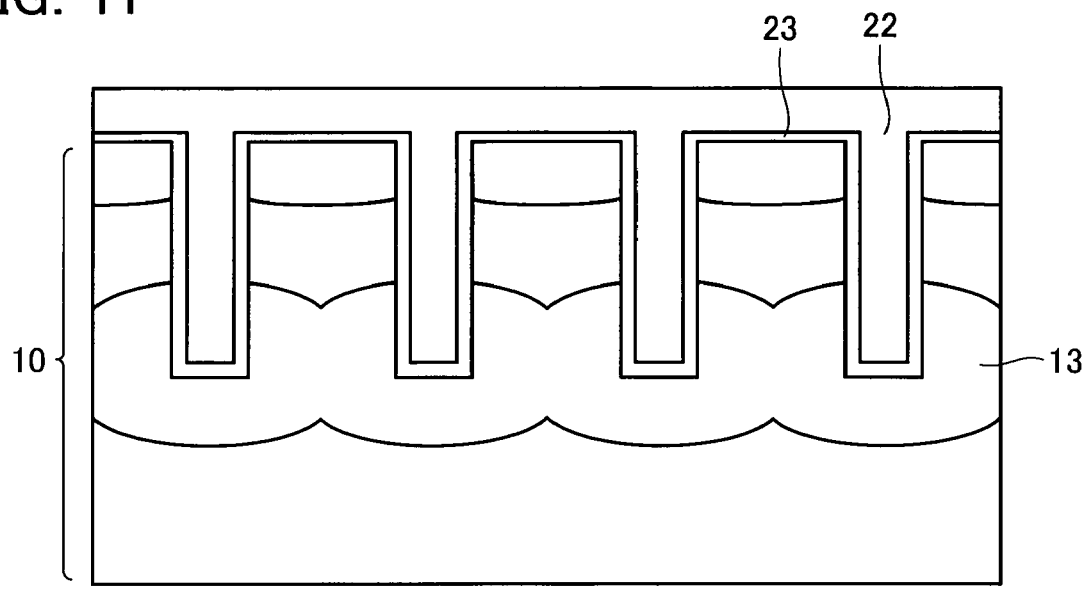
FIG. 11 is a process diagram showing a manufacturing process of the semiconductor device according to the second embodiment.

As shown in FIG. 11, n type impurities are diffused by conducting, for example, a heat treatment on the semiconductor substrate 10. The n type impurities implanted into bottoms of the trenches T bind together to form the n+ type buffer region 13 in the semiconductor substrate 10. In this case, the n type impurities implanted into the bottoms of the trenches T are separated from one another by the opening pitch of the trenches T. Due to this, the n+ type buffer region 13 formed by diffusion of the n type impurities can be formed to have a semicircular cross section. Thereafter, p type impurity, e.g., boron (B) ions are implanted into the entire surface of the semiconductor substrate 10 in which the trenches T are formed at a dose amount of, for example, 1E13 to 1E14 atom/cm$^2$ and activated using an ion implantation device. A p type semiconductor region 23 is thereby formed on the entire surface of the semiconductor substrate 10 including sidewalls and bottoms of the trenches T. Then, a filled material, e.g., polysilicon 22 doped with p type impurities is deposited on the entire surface of the semiconductor substrate 10 in which the trenches T are formed. The polysilicon 22 is also deposited into the trenches T to fill the trenches T.

Figure 12:
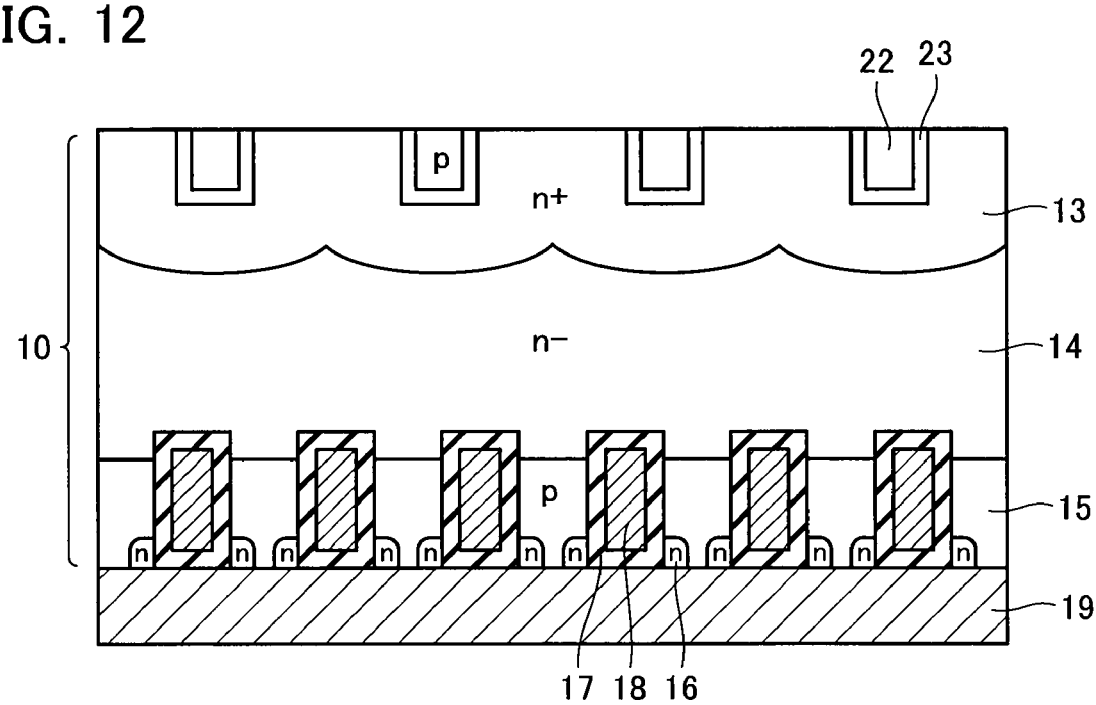
FIG. 12 is a process diagram showing a manufacturing process of the semiconductor device according to the second embodiment.

Next, as shown in FIG. 12, p type base regions 15, n type source regions 16, trench gate electrodes 18 and an emitter electrode 19 are formed on the semiconductor substrate 10 by a well-known IGBT manufacturing process. At this time, a structure such as a guard ring region may be formed in a terminal region of the semiconductor device that is not shown. Thereafter, the surface of the semiconductor substrate 10 in which the trenches T are formed is ground and flattened. At this time, the surface of the semiconductor substrate 10 may be ground either to the extent that the polysilicon 22 filled into the trenches T is left or to the extent that the polysilicon 22 filled into the trenches T is removed. In this example, the surface of the semiconductor substrate 10 is ground until the thickness of the semiconductor substrate 10 becomes, for example, 50 to 120 μm while the p type polysilicon 22 filled into the trenches T is partially left.

Figure 13:
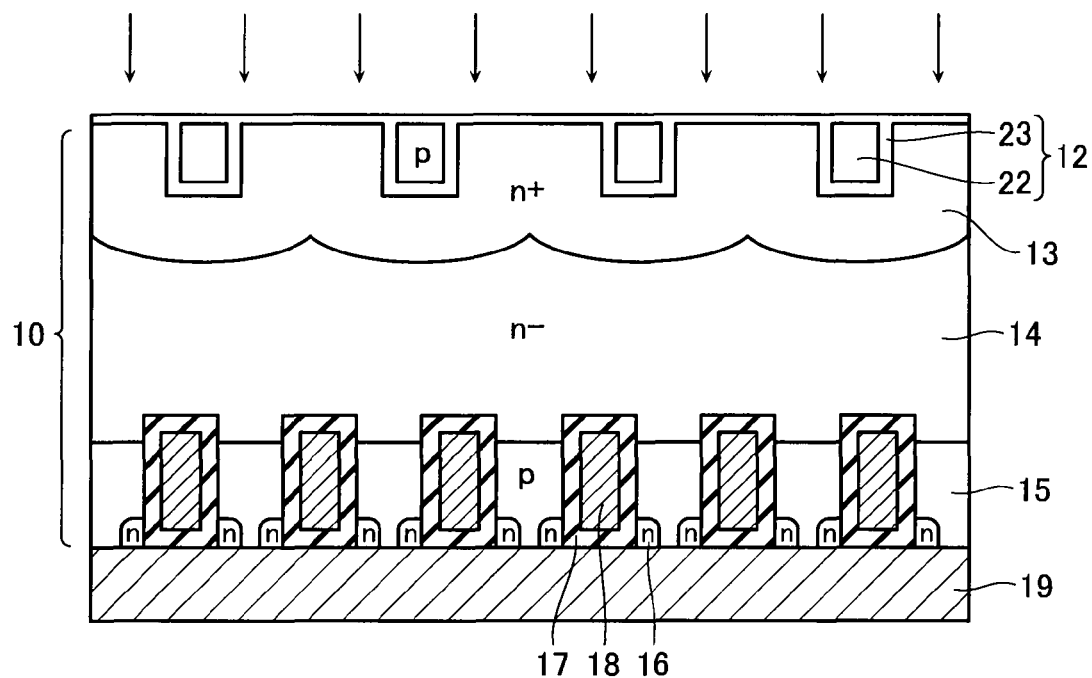
FIG. 13 is a process diagram showing a manufacturing process of the semiconductor device according to the second embodiment.

Next, as shown in FIG. 13, p type impurity, e.g., boron (B) ions are implanted into the flattened surface at a dose amount of 1E13 to 1E14 atom/cm$^2$, thereby forming the p type emitter region 12. Since the layer formed by this ion implantation is necessary so as to prevent the n+ type buffer region 13 from being connected to a collector electrode 11, it suffices that activation of the boron ions implanted after flattening is low. Namely, there is no need to conduct a high-temperature heat treatment used for ordinary activation. A conductor is deposited on the p type emitter region 12 thus formed, thereby forming the collector electrode 11. As a consequence, the semiconductor device 2 shown in FIG. 10 can be obtained. In this case, the p type emitter region 12 having concave and convex portions on a junction interface between the p type emitter region 12 and the n+ type buffer region 13 can be formed by the p type semiconductor region 23 formed nearing the vicinity of the sidewalls and bottoms of the trenches T, the p type polysilicon 22 filled into the trenches T and the boron ion implantation.

With the method of manufacturing the semiconductor device 1 according to the first embodiment, grinding accuracy for the semiconductor substrate 10 influences the effective dose amount of the n type impurities of the n+ type buffer region 13. As a result, an injection quantities of holes injected into the n− type base region 14 from the p type emitter region 12 via the n+ type buffer region 13 during the on-operation also varies depending on the grinding accuracy for the semiconductor substrate 10. The grinding of the semiconductor substrate 10 may possibly influence characteristics of the semiconductor device 1. With the method of manufacturing the semiconductor device 2 according to the second embodiment, by contrast, the p type semiconductor region 23 is formed and the p type polysilicon 22 is deposited into the trenches before grinding the semiconductor substrate 10, thereby forming the p type emitter region 12. Therefore, grinding accuracy for the semiconductor substrate 10 does not influence the quantity of holes injected from the p type emitter region 12. Furthermore, since the junction interface between the p type emitter region 12 and the n+ type buffer region 13 is formed to have concave and convex portions, a contact area between the p type emitter region 12 and the n+ type buffer region 13 is widened, which improves efficiency of injection of holes from the p type emitter region 12.

Third Embodiment

Figure 14:
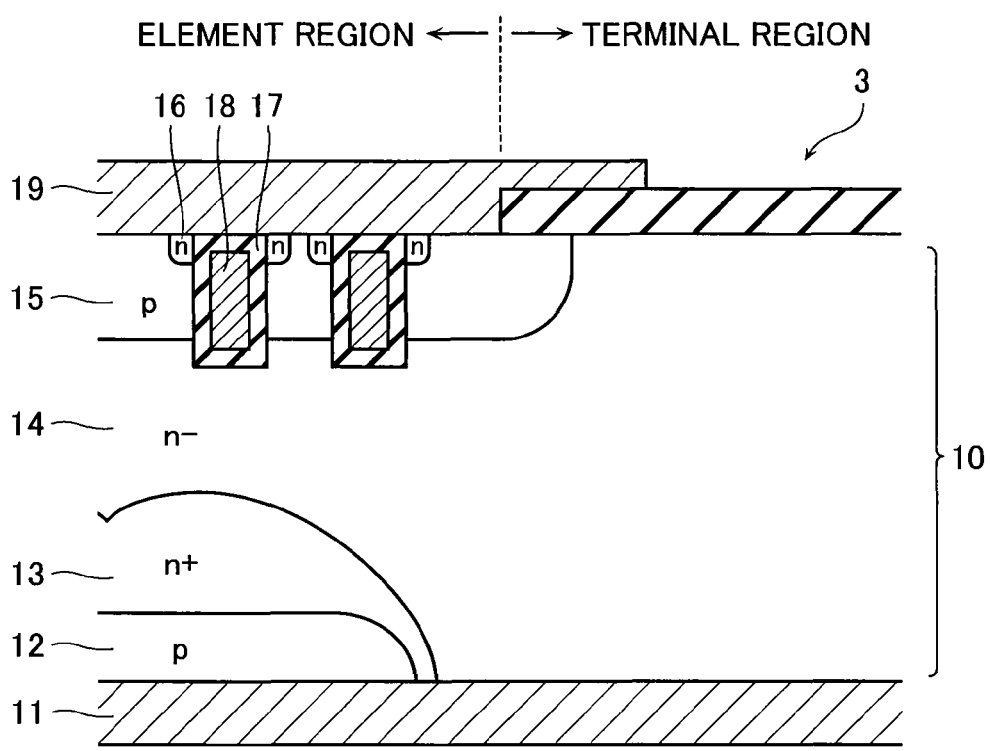
FIG. 14 is a cross-sectional view typically showing a configuration of a semiconductor device according to a third embodiment of the present invention.

FIG. 14 is a cross-sectional view typically showing a configuration of a semiconductor device according to a third embodiment of the present invention. Similar constituent elements of the semiconductor device 3 according to the third embodiment to those according to the first embodiment are assigned with the same reference symbols and the description thereof will be omitted.

Figure 15:
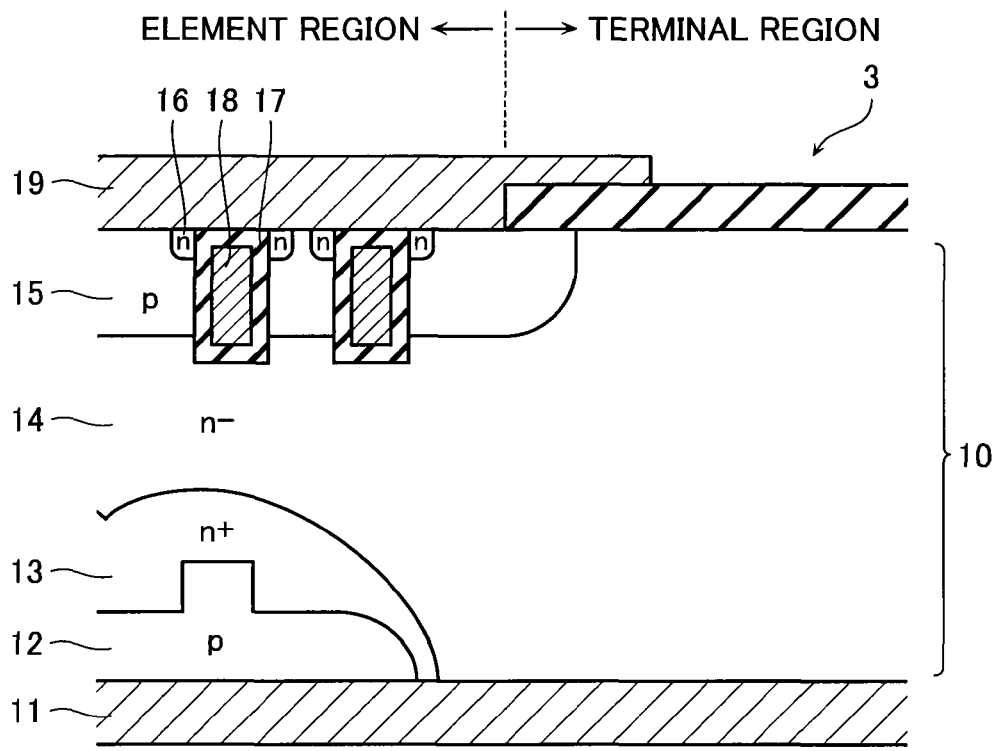
FIG. 15 is a cross-sectional view typically showing a configuration of a semiconductor device according to a modification of the third embodiment.

As shown in FIG. 14, in the semiconductor device 3 according to the third embodiment, an n+ type buffer region 13 and a p type emitter region 12 are formed selectively only in an element region. The element region herein refers to a region in which an IGBT is constituted by forming a p type base layer 15, an n type source layer 16, emitter electrodes 19 and the like on an upper surface of a semiconductor substrate 10. On the other hand, a terminal region is a region formed to surround the element region on the semiconductor substrate 10. In the semiconductor device 3 according to this embodiment, the n+ type buffer region 13 can be produced by forming trenches T only on a rear surface of the element region and injecting n type impurities therein. The p type emitter region 12 shown in FIG. 14 is formed to be flat similarly to the first embodiment. Alternatively, as shown in FIG. 15, the n+ type buffer region 13 and the p type emitter region 12 can be formed so that a junction interface between the n+ type buffer region 13 and the p type emitter region 12 has concave and convex portions similarly to the second embodiment.

During an off-operation of the semiconductor device 3 according to the third embodiment, a depletion layer spreads from a junction interface between the p type base region 15 and the n− type base region 14. This depletion layer spreads toward the terminal region and reaches the n+ type buffer region 13 formed in the element region. An avalanche breakdown occurs due to a high electric field within the depletion layer that reaches the n+ type buffer region 13. However, since avalanche current flows while being dispersed to follow a route passing through the entire element region, the current does not concentrate on terminal portions or the like to cause element destruction. The breakdown voltage of the semiconductor device 3 can be determined according to a breakdown voltage of the element region having a large area and the avalanche current can flow dispersively on a large surface. It is, therefore, possible to reduce a current density during the avalanche and ensure high avalanche resistance.

Moreover, the p type emitter region 12 and the n+ type buffer region 13 are not formed in the terminal region of the semiconductor device 3 according to the third embodiment. During an on-operation of this semiconductor device 3, holes are not injected from the p type emitter region 12 and no carriers are, therefore, accumulated in the n− type base region 14 under the terminal region. During the off-operation of the semiconductor device 3, therefore, the current caused by the carriers accumulated in the terminal region does not concentrate on outermost peripheral portions of the element region and thus element destruction in the outer peripheral portions of the element region does not occur.

Figure 16:
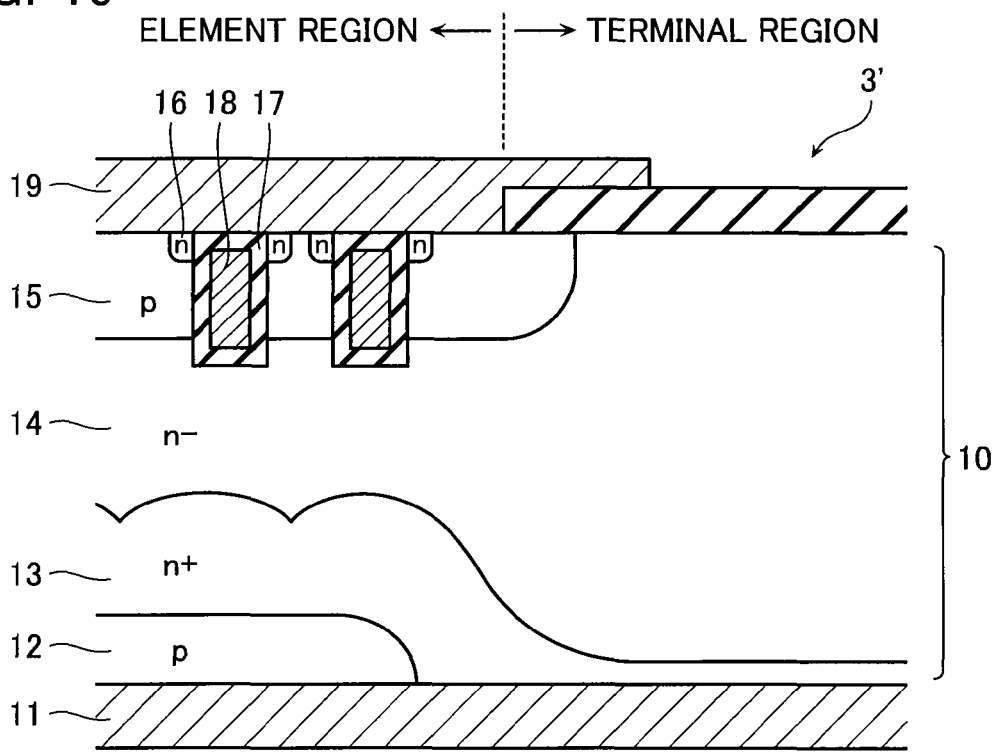
FIG. 16 is a cross-sectional view typically showing a configuration of a semiconductor device according to another modification of the third embodiment.

FIG. 16 is a cross-sectional view typically showing a semiconductor device according to a modification of the third embodiment of the present invention. Similar constituent elements of the semiconductor device 3' according to the modification of the third embodiment to those according to the first embodiment are assigned with the same reference symbols and the description thereof will be omitted.

As shown in FIG. 16, a p type emitter region 12 of the semiconductor device 3' according to this modification is formed selectively only in an element region similarly to the third embodiment. On the other hand, an n type region extending from an n+ type buffer region 13 is formed in a terminal region. It is to be noted, however, that the n type region is provided to be smaller in a distance from a rear surface of a semiconductor substrate 10 in a depth direction than the n+ type buffer region 13. The semiconductor device 3' differs from the semiconductor device 3 according to the third embodiment in this respect.

By configuring the semiconductor device 3' as described above, the modification of the third embodiment can exhibit the following advantages over the third embodiment. During the off-operation of the semiconductor device 3 according to the third embodiment, if the depletion layer spreading from the junction interface between the p type base region 15 and the n− type base region 14 reaches the collector electrode 11, leakage current increases. Therefore, it is necessary to design the semiconductor device 3 so that the depletion layer does not directly reach the collector electrode 11 in the terminal region. In the semiconductor device 3' according to the modification of the third embodiment, by contrast, even if a depletion layer spreading from a junction interface between a p type base region 15 and an n− type base region 14 extends toward the n− type base region 14 in the terminal region, the depletion layer contacts with the n type region extending from the n+ type buffer region 13 and formed in the terminal region and stops spreading. Since the depletion layer does not reach a collector electrode 11 of the semiconductor device 3', it is possible to suppress leakage of current to the collector electrode 11.

A method of manufacturing the semiconductor device 3' according to the modification of the third embodiment will be described with reference to FIGS. 17 to 19.

Figure 17:
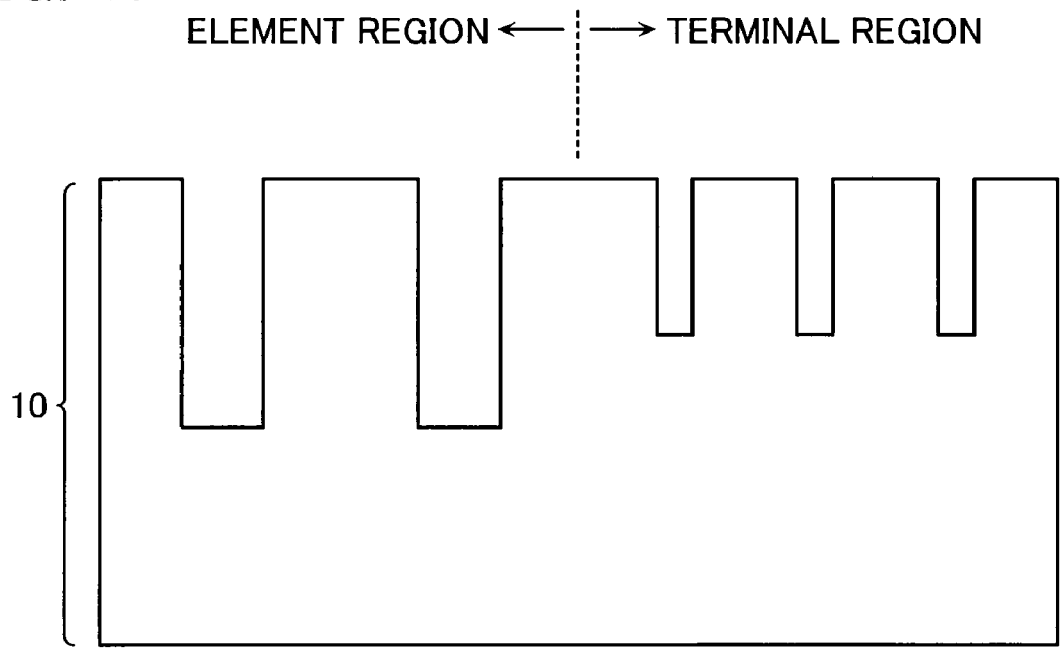
FIG. 17 is a process diagram showing a manufacturing process of the semiconductor device according to the third embodiment.

As shown in FIG. 17, trenches T are formed in the element region and the terminal region of the semiconductor substrate 10. In this embodiment, the trenches T are formed using a micro-loading effect that allows adjustment of a depth of each trench T according to a width of an opening of a mask. Namely, deep trenches T are formed in the element region using a mask having a wide opening and shallow trenches T are formed in the terminal region using a mask having a narrow opening.

Figure 18:
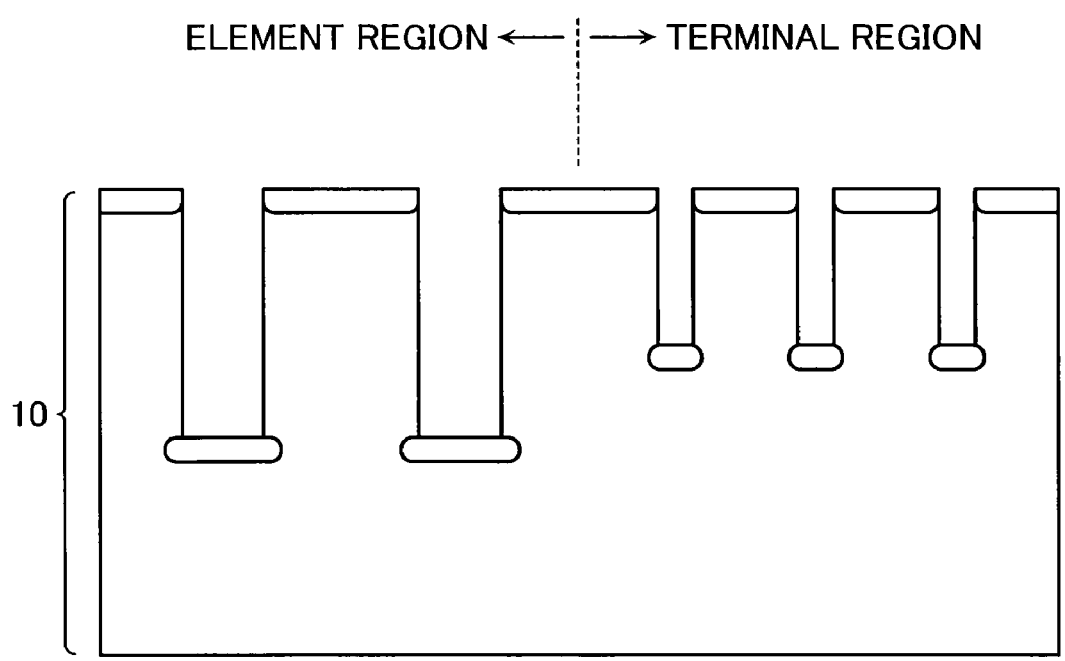
FIG. 18 is a process diagram showing a manufacturing process of the semiconductor device according to the third embodiment.

Next, as shown in FIG. 18, n type impurity, e.g., arsenic (As) ions are implanted into an entire surface of the semiconductor substrate 10 in which the trenches T are formed in the element region and the terminal region thereof using an ion implantation device. In this modification, a dose amount of the ions implanted into the semiconductor substrate 10 is set to, for example, 1E12 to 1E13 atom/cm$^2$.

Figure 19:
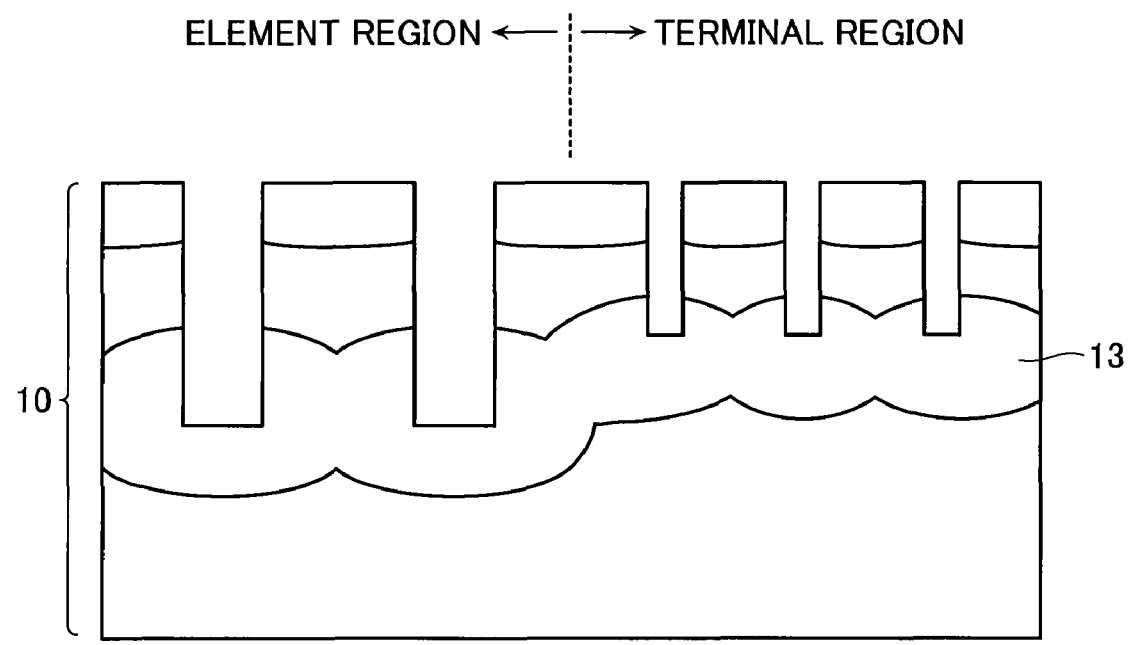
FIG. 19 is a process diagram showing a manufacturing process of the semiconductor device according to the third embodiment.

Next, as shown in FIG. 19, n type impurities are diffused by conducting, for example, a heat treatment on the semiconductor substrate 10. The n type impurities implanted into bottoms of the trenches T bind together to form the n+ type buffer region 13 in the semiconductor substrate 10. In this case, the trenches T formed in the element region differ in depth from those formed in the terminal region. Therefore, the junction interface between the n+ type buffer region 13 and the n− type base region 14 can be formed so as to have different depths between the element region and the terminal region.

Thereafter, similarly to the first and second embodiments, the semiconductor device 3' is formed by a well-known IGBT manufacturing process. Then, the surface of the semiconductor substrate 10 in which the trenches T are formed is ground to the extent that the n+ type buffer region 13 and a p type emitter region 12 are formed in the element region and that the shallow n+ type buffer region 13 is formed in the terminal region. In this way, the semiconductor device 3' in which the thin n+ type buffer region 13 is also formed in the terminal region can be obtained.

Fourth Embodiment

Figure 20:
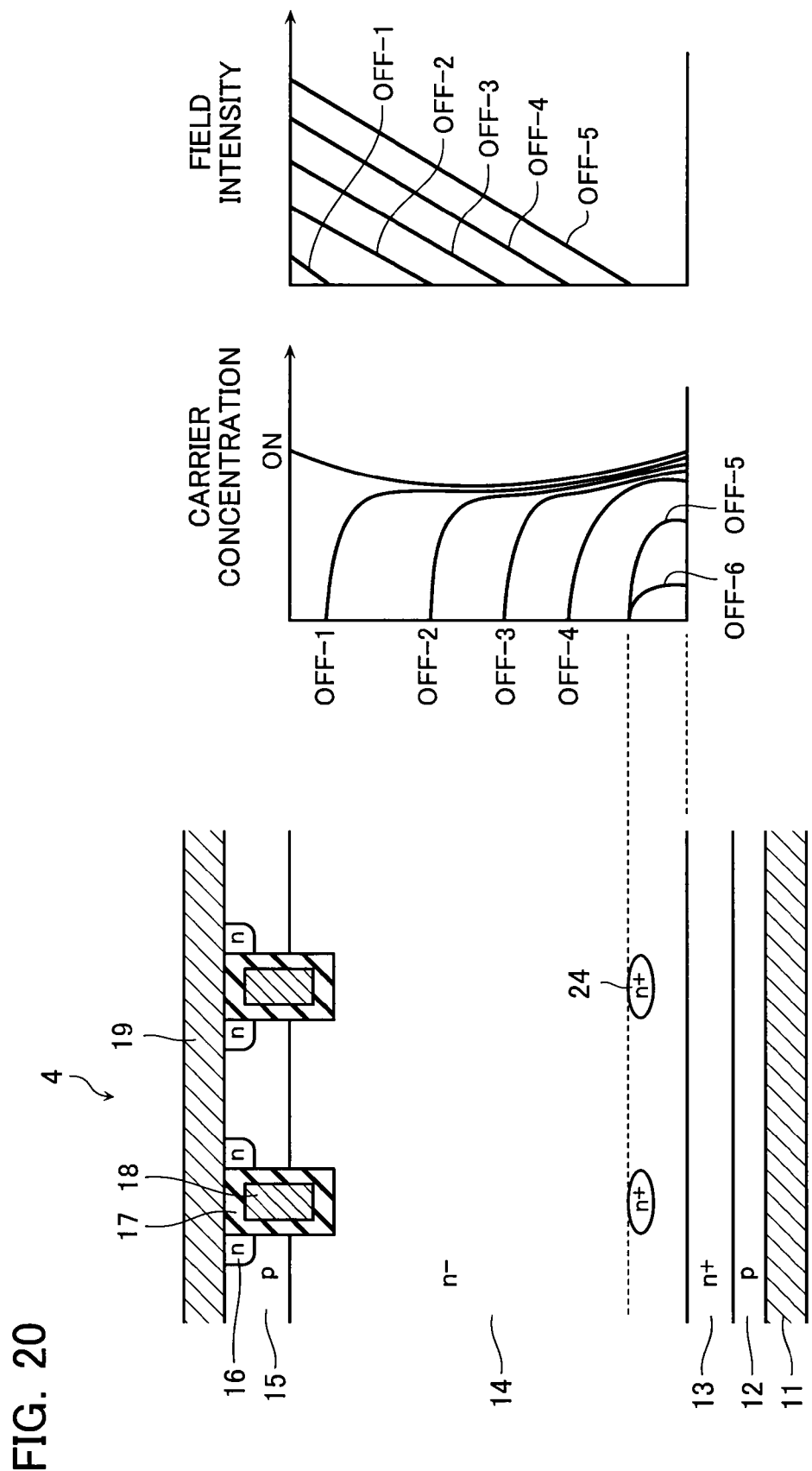
FIG. 20 is a cross-sectional view typically showing a configuration of a semiconductor device according to a fourth embodiment of the present invention.

FIG. 20 is a cross-sectional view typically showing a configuration of a semiconductor device according to a fourth embodiment of the present invention. The right part of FIG. 20 is a graph showing carrier concentrations during an on-operation and an off-operation and a field intensity during the off-operation of the semiconductor device 4 in association with the configuration of the semiconductor device 4. Similar constituent elements of the semiconductor device 4 according to the fourth embodiment to those according to the first embodiment are assigned with the same reference symbols and the description thereof will be omitted.

As shown in FIG. 20, a high concentration n+ type diffusion region 24 is formed in an n− type base region 14 of the semiconductor device 4 according to this embodiment. The n+ type diffusion region 24 can be formed by ion implantation at a dose amount of about 1E13 atom/cm$^2$. A plurality of n+ type diffusion regions 24 is formed at positions away from a surface of an n+ type buffer region 13 by a certain distance in the n− type base region 14, respectively. Each of the n+ type diffusion regions 24 may be formed to have a spherical shape or a stripe shape extending in a direction perpendicular to the sheet in FIG. 20. Alternatively, each n+ type diffusion region 24 may have a mesh plane shape.

Figure 21:
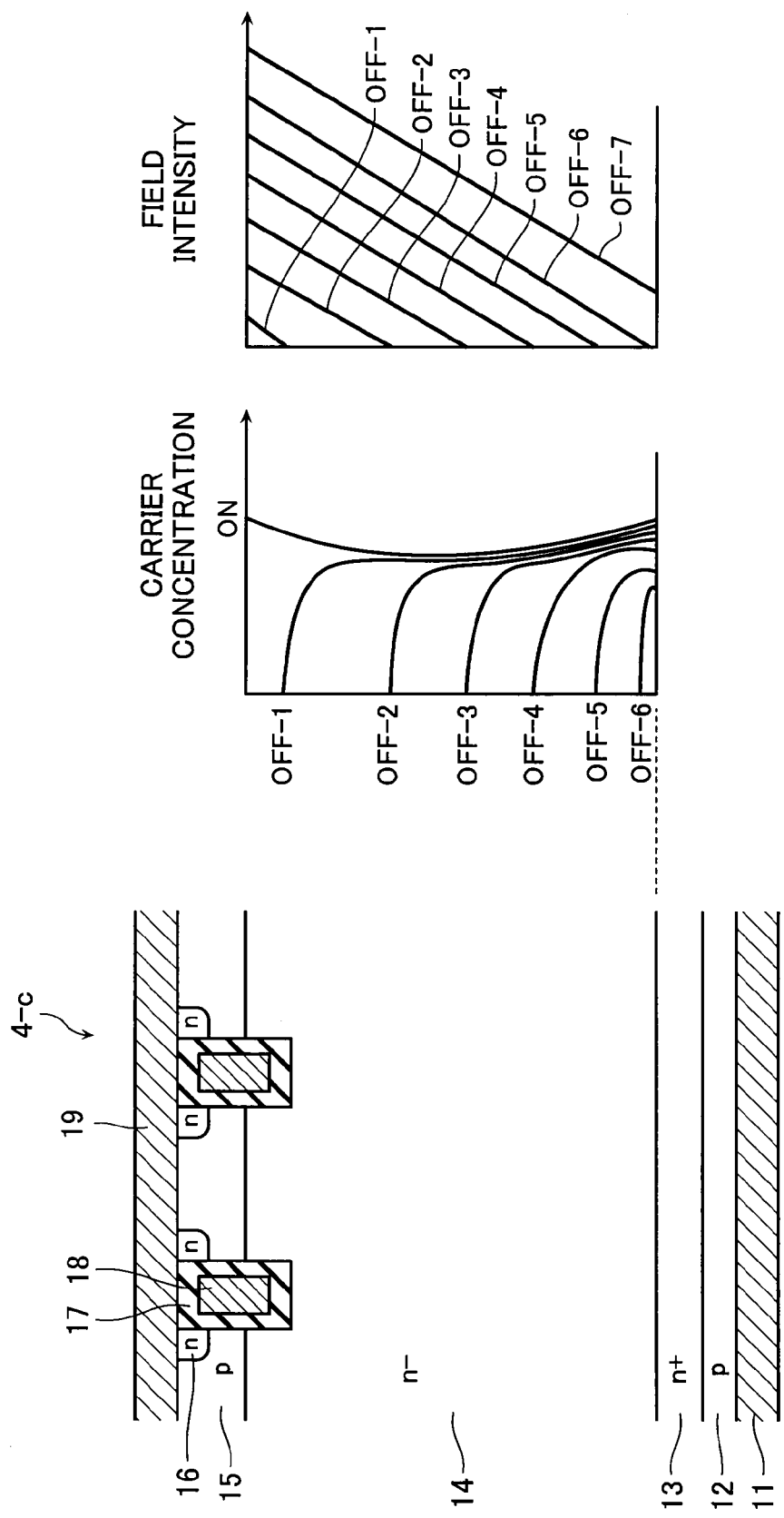
FIG. 21 is a cross-sectional view typically showing a configuration of a semiconductor device according to a comparative example of the fourth embodiment.
Figure 22:
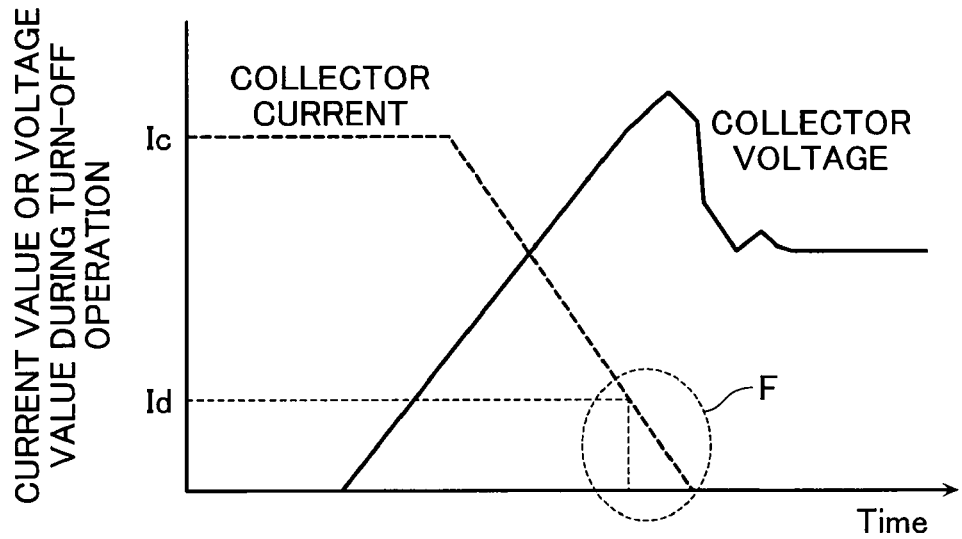
FIG. 22 is a waveform view showing current and voltage waveforms when the semiconductor device according to the fourth embodiment is turned off.
Figure 23:
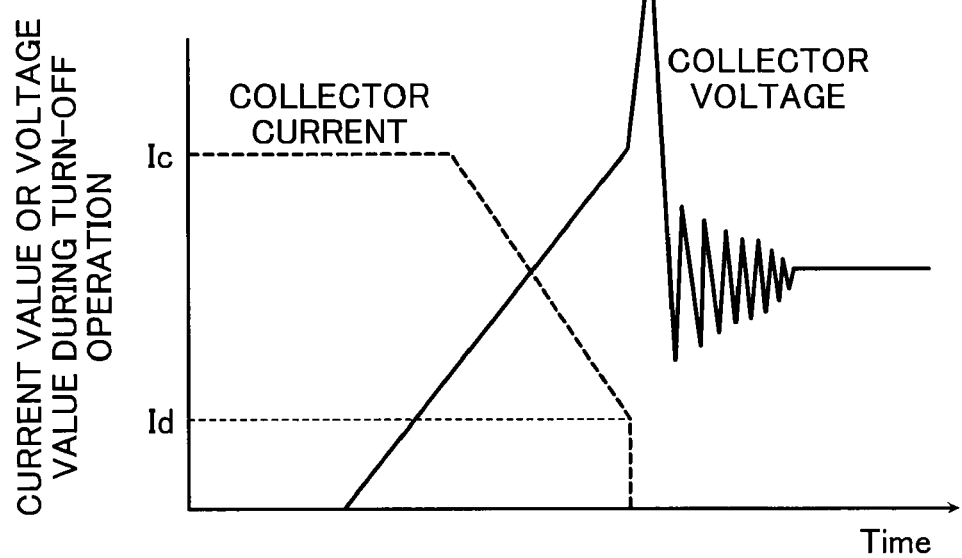
FIG. 23 is a waveform view showing current and voltage waveforms when the semiconductor device according to the comparative example of the fourth embodiment is turned off.

Operations of the semiconductor device 4 configured as described above will be described while referring to a comparative example. FIG. 21 is a cross-sectional view typically showing a configuration of a semiconductor device according to the comparative example of the fourth embodiment. The right part of FIG. 21 is a graph showing carrier concentrations during an on-operation and an off-operation and a field intensity during the off-operation of the semiconductor device 4-*c* in association with the configuration of the semiconductor device 4-*c*. Similar constituent elements of the semiconductor device 4-*c* according to the comparative example to those according to the fourth embodiment are assigned with the same reference symbols and the description thereof will be omitted. The semiconductor device 4-c according to the comparative example shown in FIG. 21 differs from the semiconductor device 4 according to the fourth embodiment in that no n+ type diffusion regions 24 are provided in the n− type base region 14. FIGS. 22 and 23 are waveform views showing waveforms of collector currents and collector voltages when the semiconductor devices 4 and 4-c according to the fourth embodiment and the comparative example are turned off, respectively.

In the semiconductor device 4-c according to the comparative example, the carrier concentration of carriers (electrons or holes) accumulated in the n− type base region 14 during electrical conduction is shown as ON in the graph of the right part of FIG. 21. After the semiconductor device 4-c is turned off, a depletion layer spreads from a junction interface between a p type base region 15 and an n− type base region 14 and carriers decrease from the p type base region 15 side of the n− type base region 14. A change in the carrier concentration during this operation is shown as OFF-1 to OFF-6 in the graph in the right part of FIG. 21. Field intensities of the electric field spreading in the n− type base region 14 during this operation are shown as OFF-1 to OFF-7 in the graph in the right part of FIG. 21.

As the depletion layer generated in the n− type base region 14 spreads, carriers are emitted from the n− type base region 14. After the carrier concentration OFF-6, when the carriers remaining in the n− type base region 14 are completely emitted, an electric field at an intensity equal to or higher than a certain intensity reaches the n+ type buffer region 13 as shown as OFF-7 in the graph of the field intensity, and the flow of a collector current suddenly stops. As a voltage V is represented by a temporal change of a current I (V=Ls (dI/dt), where Ls is a parasitic inductance of a circuit), noise is disadvantageously generated due to a voltage generated by a sudden change of the collector current (see FIG. 23).

In an IGBT, it suffices to make the n− type base region 14 thinner so as to lessen loss during electrical conduction and to improve high-speed carrier mobility while the IGBT is turned on. However, if the n− type base region 14 is made thinner, oscillation occurs to the waveform and noise is generated as shown in FIG. 23. Since this noise may cause malfunction of other electric devices, influence communication or the like and influence a control system for devices or the like, it is desired to reduce the noise.

The carrier concentration of carriers (electrons or holes) accumulated in the n− type base region 14 in the semiconductor device 4 according to the fourth embodiment during electrical conduction is shown as ON in the graph in the right part of FIG. 20. After the semiconductor device 4 is turned off, a depletion layer spreads from a junction interface between a p type base region 15 and the n− type base region 14 and the carriers decrease from the p type base region 15 side of the n− type base region 14. A change in the carrier concentration during this operation is shown as OFF-1 to OFF-6 in the graph in the right part of FIG. 20. Field intensities of the electric field spreading in the n− type base region 14 during this operation are shown as OFF-1 to OFF-5 in the graph in the right part of FIG. 20.

In the semiconductor device 4 according to this embodiment, the n+ type diffusion regions 24 in the n− type base region 14 stop the extension of the depletion layer. Therefore, the electric field at field intensity equal to or higher than a certain intensity does not spread below a portion corresponding to the carrier concentration OFF-5. Since the carriers remaining between each n+ type diffusion region 24 and the n+ type buffer region 13 are emitted gradually, flow of the collector current does not stop suddenly. Accordingly, a voltage V represented by a temporal change of the current I (V=Ls(dI/dt), where Ls is the parasitic inductance of the circuit) does not rise suddenly and noise is, therefore, reduced (see FIG. 22). As described above, the semiconductor device 4 according to this embodiment can prevent generation of noise during the off-operation.

Figure 24:
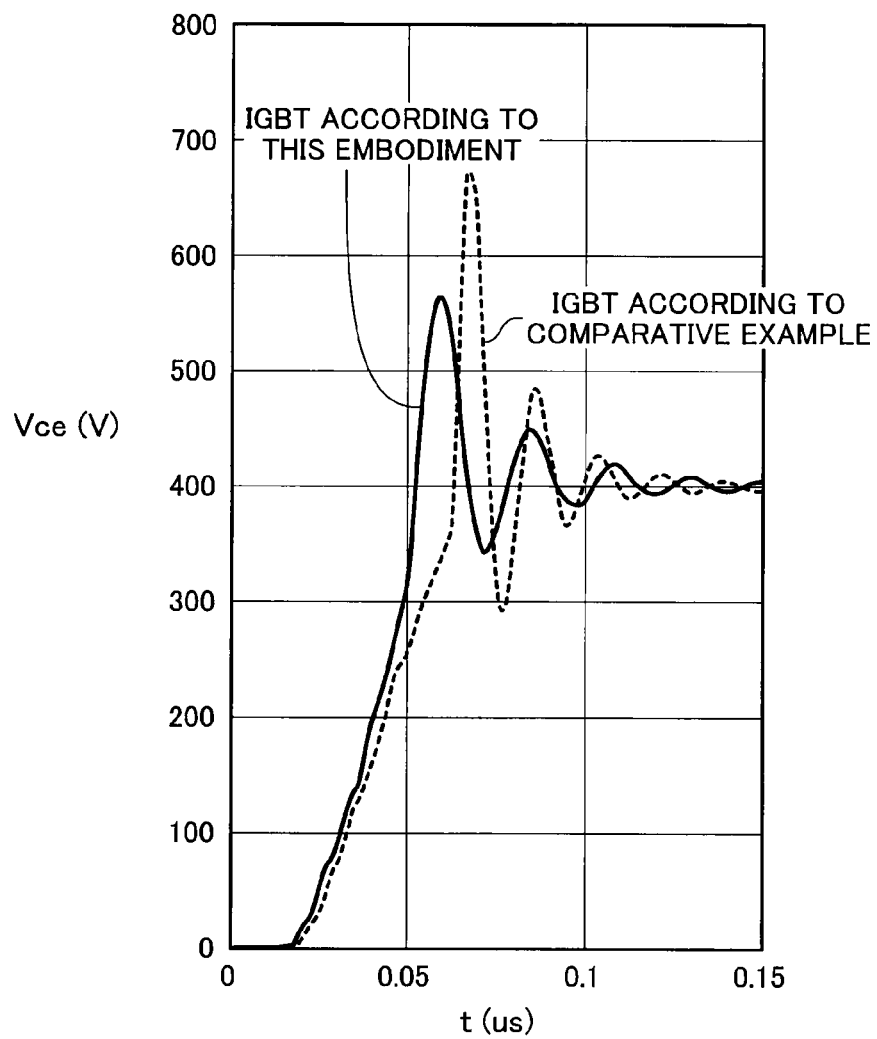
FIG. 24 is a waveform view showing voltage waveforms when the semiconductor device according to the fourth embodiment and the semiconductor device according to the comparative example of the fourth embodiment are turned off, respectively.

FIG. 24 is a waveform view showing simulated waveforms of collector voltages when the semiconductor device 4 according to the fourth embodiment and the semiconductor device 4-c according to the comparative example are turned off, respectively. As shown in FIG. 24, with a structure according to the fourth embodiment, oscillation of the voltage waveform is suppressed. During this operation, since the extension of the depletion layer is stopped by the n+ type diffusion regions 24, a breakdown voltage of the semiconductor device 4 according to the fourth embodiment falls. However, since the oscillation of the voltage is suppressed to be small, this fall in the breakdown voltage does not particularly matter. Further, with the structure according to the fourth embodiment, voltage drop and switching loss during the electrical conduction hardly change.

Specific arrangement of the n+ type diffusion regions 24 in the n− type base region 14 in the semiconductor device 4 according to the fourth embodiment will be described with reference to FIG. 26. The n+ type diffusion regions 24 are formed into elliptical spheres and provided to be scattered in the n− type base region 14.

Figure 26:
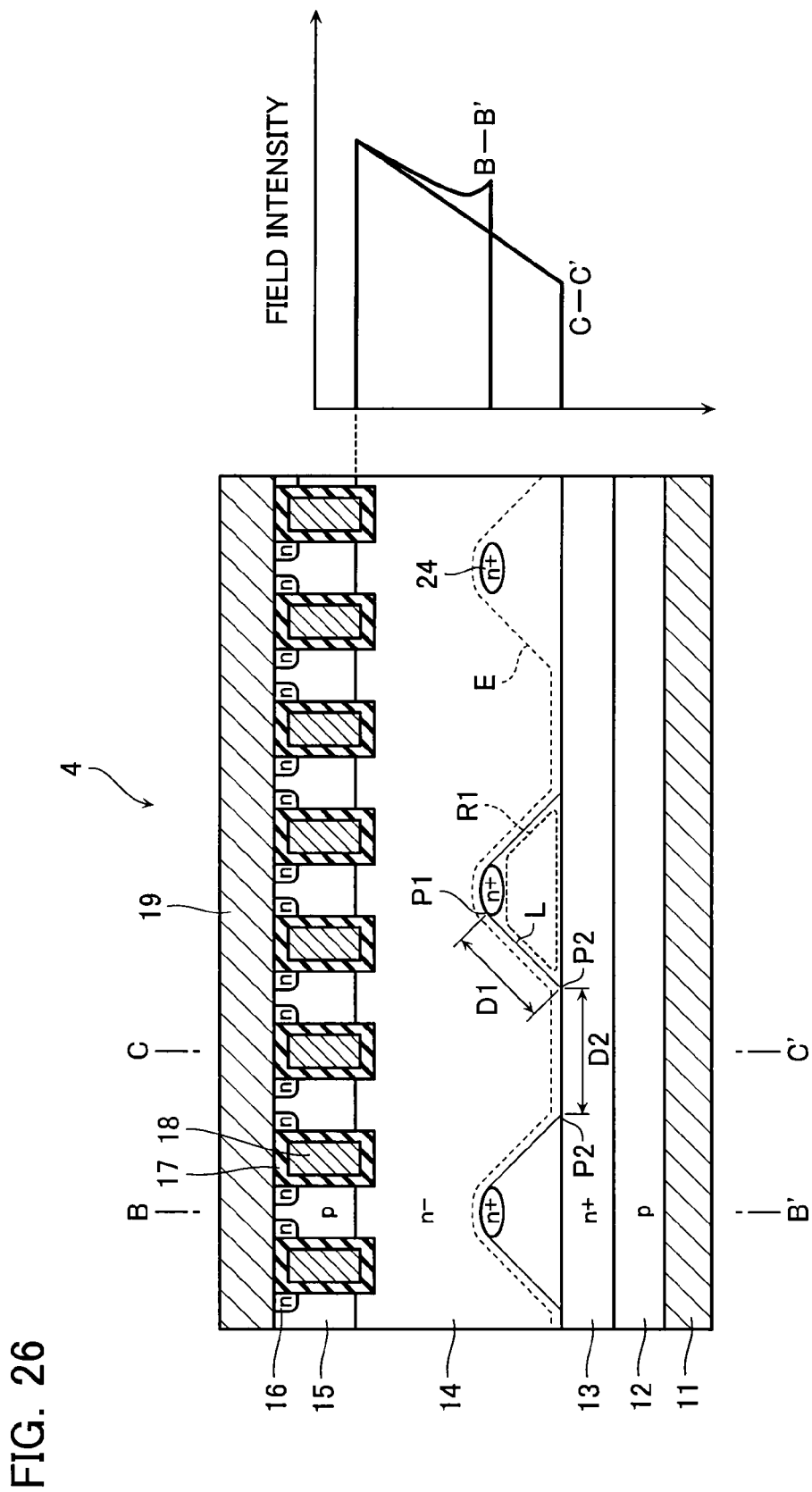
FIG. 26 is a cross-sectional view typically showing a configuration of a semiconductor device according to the fourth embodiment.

As shown in FIG. 26, a line L in contact with an n+ type diffusion region 24 and inclined at 45 degrees with respect to a surface of the n+ type buffer region 13 is considered. It is assumed that a distance from a point P1 at which the line L contacts with the n+ type diffusion region 24 to a point P2 at which the line L contacts with the n+ type buffer region 13 is D1. It is also assumed that a distance between two adjacent points P2 is D2. A distance between the two adjacent n+ type diffusion regions 24 in the n− type base region 14 is set to approximately satisfy D2>D1. Further, a volume of a region R1 obtained by rotating the line L in contact with the n+ type diffusion region 24 along the n+ type diffusion region 24 is preferably equal to or greater than 1% of an entire volume of the n− type base region 14.

During the off-operation of the semiconductor device 4 according to the fourth embodiment shown in FIG. 26, the depletion layer spreads from the junction interface between the p type base region 15 and the n− type base region 14. As shown by a broken line E in FIG. 26, the n+ type diffusion regions 24 in the n− type base region 14 stop the extension of the depletion layer. However, since the n+ type diffusion regions 24 are scattered in the n− type base region 14, the depletion layer extends between the n+ type diffusion regions 24 to the extent that the depletion layer reaches the n+ type buffer region 13. Since the n+ type diffusion regions 24 are provided at such wide intervals as described above, the breakdown voltage of the semiconductor device 4 does not fall even if high-concentration n+ type diffusion regions 24 are provided in the n− type base region 14.

A graph shown in the right part of FIG. 26 shows field intensities in a B-B' line part and a C-C' line part of the n− type base region 14. In the C-C' line part in which the n+ type diffusion region 24 is not formed, the field intensity is lower as closer to the n+ type buffer region 13. Likewise, in the B-B' line part in which the n+ type diffusion region 24 is formed, the field intensity is lower as closer to the n+ type buffer region 13. Since each n+ type diffusion region 24 stops the extension of the depletion layer, the depletion layer around the n+ type diffusion region 24 has a curvature to thereby increase the field intensity. However, even if field concentration occurs around each n+ type diffusion region 24, the field intensity at this location is not so high as to destroy the element since this location is close to the n+ type buffer region and the field intensity is originally low.

Now referring to FIG. 22, a current value Id when the depletion layer reaches the n+ type buffer region 13 during the turn-off operation of the semiconductor device 4 is empirically about 20% or lower of a current value Ic during electrical conduction. Thereafter, a charge amount necessary to carry a tail current (F part in FIG. 22) so as not to increase dI/dt is required to be equal to or larger than 4% of the carriers accumulated in the entire n− type base region 14. To make the carriers accumulated in the region R1 below each n+ type diffusion region 24 equal to or more than 4% of the carriers accumulated in the entire n− type base region 14, it suffices that a volume of the region R which is below each n+ type diffusion region 24 and in which the depletion layer does not extend is equal to or larger than 1% of a volume of the n− type base region 14.

As a method of manufacturing the semiconductor device including such n+ type diffusion regions 24, the following method may be adopted. First, a thin n type epitaxial layer is provided on the n+ type buffer region 13 and n type impurity ions such as arsenic (As) ions are selectively implanted. Then, an n type epitaxial layer is additionally provided to thereby form the n− type base region 14, and an IGBT structure is formed on the n− type base region 14 by a known method.

Figure 25:
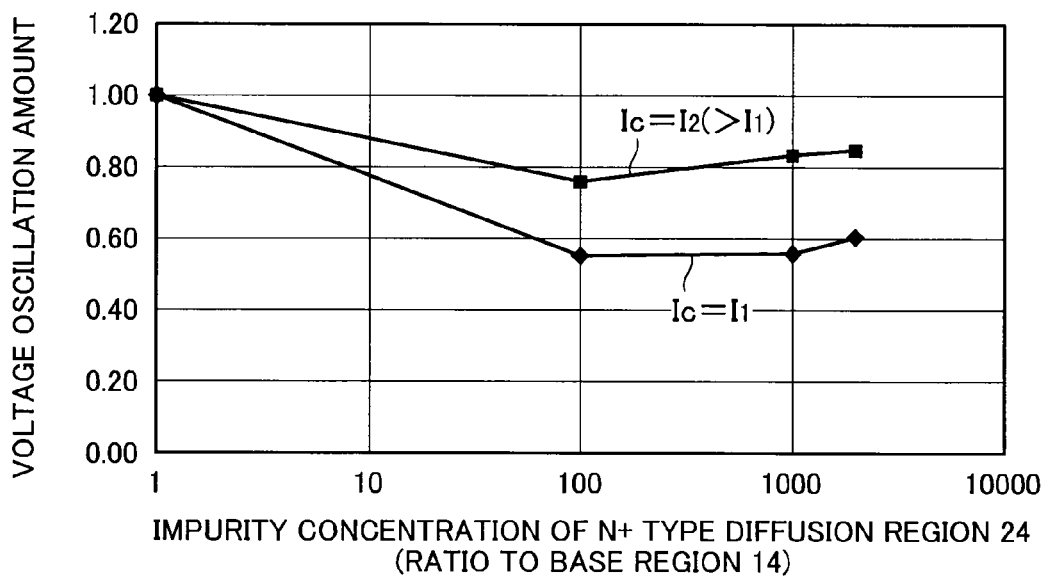
FIG. 25 is a graph showing a result of a computer simulation on setting of an impurity concentration of an n+ type diffusion region 24 in the semiconductor device according to the fourth embodiment.

According to a computer simulation result, it is preferable that each of the n+ type diffusion regions 24 has a low impurity concentration to the extent that the n+ type diffusion regions 24 are depleted in itself so as to effectively suppress the extension of the depletion layer using the n+ type diffusion regions 24. FIG. 25 is a graph showing a result of this simulation, in which a horizontal axis represents the impurity concentration of the n+ type diffusion regions 24 (a ratio of the impurity concentration of the n+ type diffusion regions 24 to that of the n− type base region 14) and a vertical axis represents a voltage oscillation amount during a switching operation (a ratio of the voltage oscillation amount during the switching operation to that in a case without the n+ type diffusion regions 24). The result of the simulation according to two different collector current value I1 and I2 (I1<I2) during the switching operation is shown in FIG. 25. As is apparent from this graph, the voltage oscillation amount can be reduced to the smallest level when the impurity concentration of the n+ type diffusion regions 24 is set to about 100 to 1000 times as high as that of the n− type base region 14. The same thing is true irrespectively of a magnitude of the collector current Ic during the switching operation.

Figure 27:
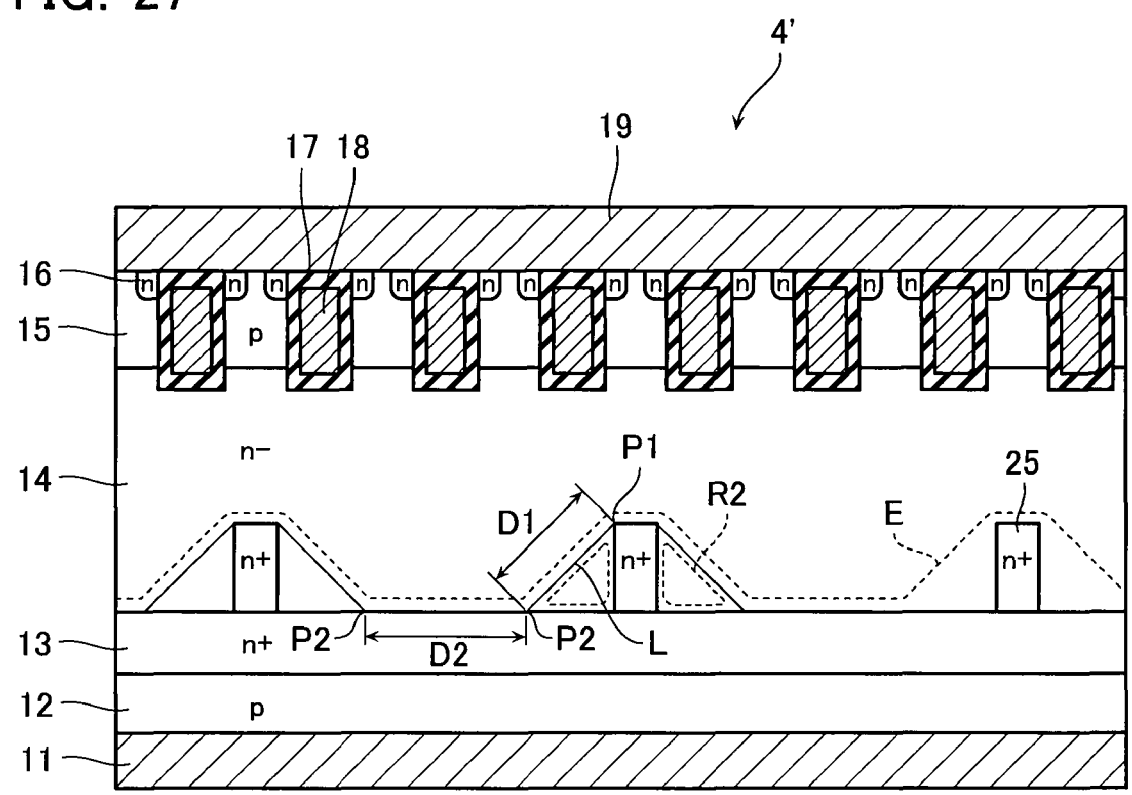
FIG. 27 is a cross-sectional view typically showing a configuration of a semiconductor device according to a modification of the fourth embodiment.

FIG. 27 is a cross-sectional view typically showing a configuration of a semiconductor device according to a modification of the fourth embodiment of the present invention. Similar constituent elements of the semiconductor device 4' according to the modification of the fourth embodiment to those according to the first embodiment are assigned with the same reference symbols and the description thereof will be omitted.

As shown in FIG. 27, similarly to the fourth embodiment, n+ type diffusion regions 25 are formed in an n− type base region 14 in the semiconductor device 4' according to this modification. The n+ type diffusion region 25 of this modification differs from the n+ type diffusion region 24 in that the n+ type diffusion region 25 is provided in contact with an n+ type buffer region 13.

By configuring the semiconductor device 4' as described above, similar advantages to those of the fourth embodiment can also be achieved. Namely, during an off-operation of the semiconductor device 4', extension of a depletion layer from a junction interface between a p type base region 15 and the n− type base region 14 is stopped by the n+ type diffusion regions 25 in the n− type base region 14, as shown by a broken line E in FIG. 27. However, since the n+ type diffusion regions 25 are scattered in the n− type base region 14, the depletion layer extends between the n+ type diffusion regions 25 to the extent that the depletion layer reaches the n+ type buffer region 13. Since the n+ type diffusion regions 25 are provided at such wide intervals, a breakdown voltage of the semiconductor device 4' does not fall even if high-concentration n+ type diffusion regions 25 are provided in the n− type base region 14. Moreover, even if the depletion layer reaches the n+ type buffer region 13 while the semiconductor device 4' is turned off, carriers accumulated in regions R2 are not emitted suddenly but gently by the depletion layer. Even after the depletion layer reaches the n+ type buffer region 13, the carriers are gradually emitted, and thus supply of current does not stop suddenly. Accordingly, a voltage represented by a temporal change of the current (V=Ls(dI/dt), where Ls is the parasitic inductance of the circuit) does not rise suddenly and noise is, therefore, reduced.

As a method of manufacturing the semiconductor device 4' including such n+ type diffusion regions 25, the following method may be adopted. The semiconductor device 4' can be manufactured by forming trenches in a rear surface of a semiconductor substrate 10, implanting n type impurity ions into the n− type base region 14 or the like. Since this process does not require an epitaxial process, the semiconductor device 4' can be manufactured at a lower cost than that of the semiconductor device 4 according to the fourth embodiment.

Fifth Embodiment

Figure 28:
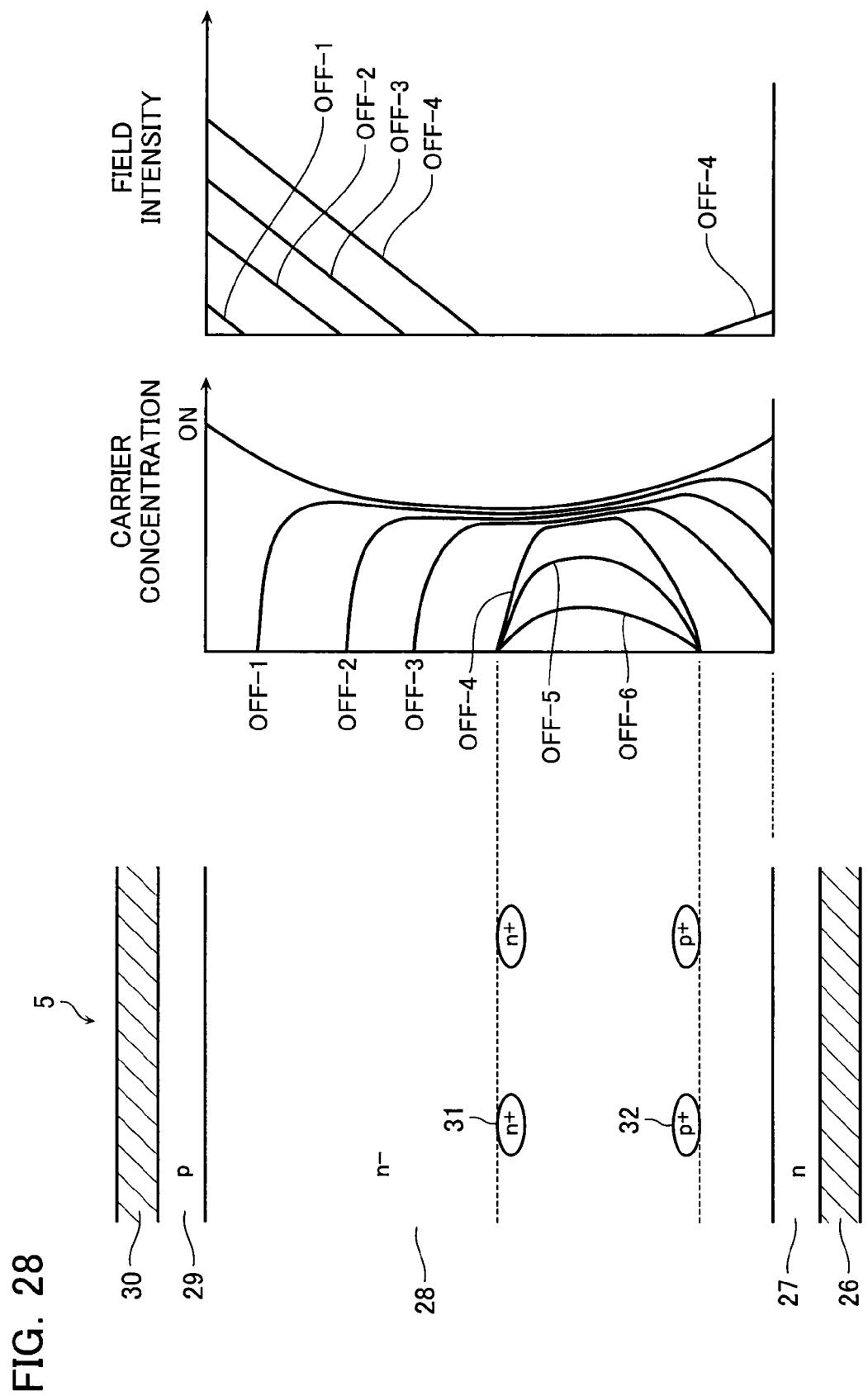
FIG. 28 is a cross-sectional view typically showing a configuration of a semiconductor device according to a fifth embodiment of the present invention.

FIG. 28 is a cross-sectional view typically showing a configuration of a semiconductor device according to a fifth embodiment of the present invention. The right part of FIG. 28 is a graph showing carrier concentrations during an on-operation and an off-operation and a field intensity during the off-operation of the semiconductor device 5 in association with the configuration of the semiconductor device 5. The semiconductor device 5 according to this embodiment is a PiN diode.

This semiconductor device 5 includes an upper surface and a lower surface opposed to each other and is formed on a semiconductor substrate 10 made of, for example, silicon (Si). An n− type semiconductor region 28 is provided in the semiconductor substrate 10. A p type emitter region 29 connected to the n− type semiconductor region 28 is provided on an upper surface of the n− type semiconductor region 28. An upper electrode 30 electrically connected to the p type emitter region 29 is provided on an upper surface of the p type emitter region 29. An n type emitter region 27 connected to the n− type semiconductor region 28 is provided on the lower surface of the n− type semiconductor region 28. It is to be noted that the n type emitter region 27 is higher in impurity concentration than the n− type semiconductor region 28. Further, a lower electrode 26 electrically connected to the n type emitter region 27 is provided on a lower surface of the n type emitter region 27.

As shown in FIG. 28, n+ type diffusion regions 31 higher in impurity concentration than the n− type semiconductor region 28 and the n type emitter region 27 are provided in the n− type semiconductor region 28 of the semiconductor device 5 according to this embodiment. A plurality of n+ type diffusion regions 31 are provided at positions away from a surface of the n type emitter region 27 by a certain distance, respectively. Furthermore, p+ type diffusion regions 32 higher in impurity concentration than the p type emitter region 29 are provided in the n− type semiconductor region 28. A plurality of p+ type diffusion regions 29 are provided at positions closer to the surface of the n type emitter region 27 than the n+ type diffusion regions 31 and away from the surface of the n type emitter region 27 by a certain distance, respectively. In this case, the n+ type diffusion regions 31 and the p+ type diffusion regions 32 are formed into elliptical spheres and provided to be scattered in the n− type semiconductor region 28. Alternatively, the n+ type diffusion regions 31 and the p+ type diffusion regions 32 may be formed into spheres or stripes extending in a direction perpendicular to the sheet in FIG. 28. In another alternative, the n+ type diffusion regions 31 and the p+ type diffusion regions 32 may have mesh plane shapes. Furthermore, the n+ type diffusion regions 31 and the p+ type diffusion regions 32 may be provided as a uniform layer in the n− type semiconductor region 28. However, considering high-speed carrier mobility during an on-operation, the n+ type diffusion regions 31 and the p+ type diffusion regions 32 are preferably structured to have patterns that can ensure a carrier flow route.

Figure 29:
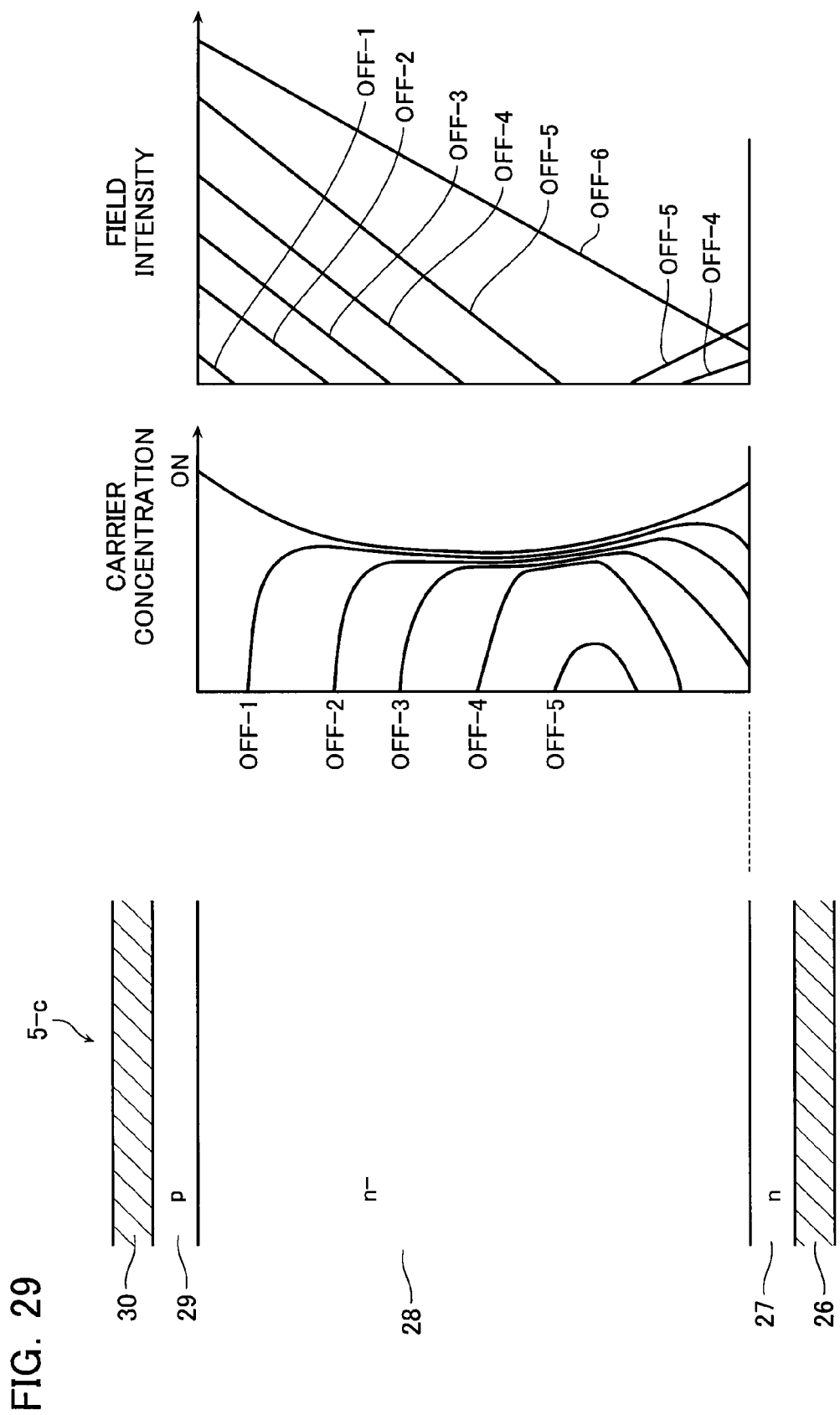
FIG. 29 is a cross-sectional view typically showing a configuration of a semiconductor device according to a comparative example of the fifth embodiment.
Figure 30:
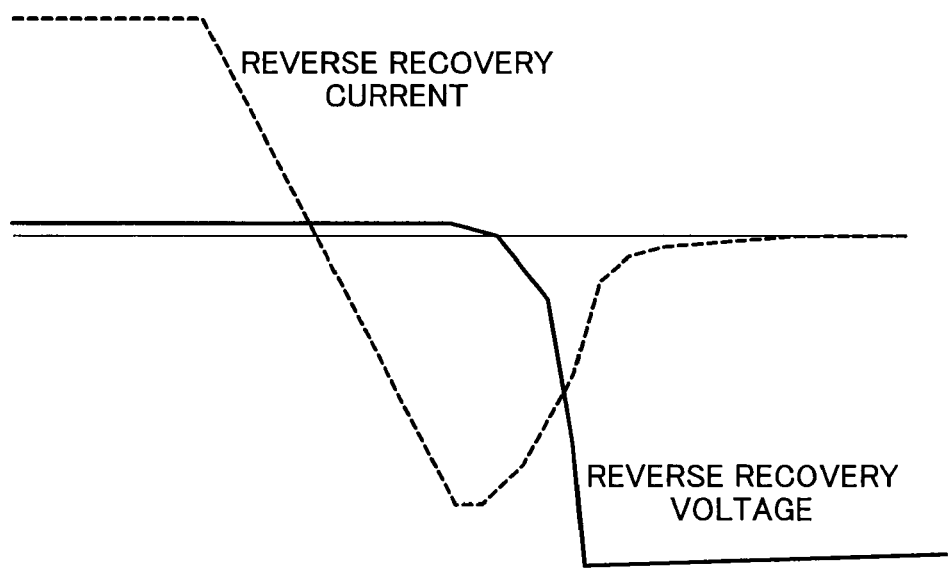
FIG. 30 is a waveform view showing current and voltage waveforms when the semiconductor device according to the fifth embodiment is turned off.
Figure 31:
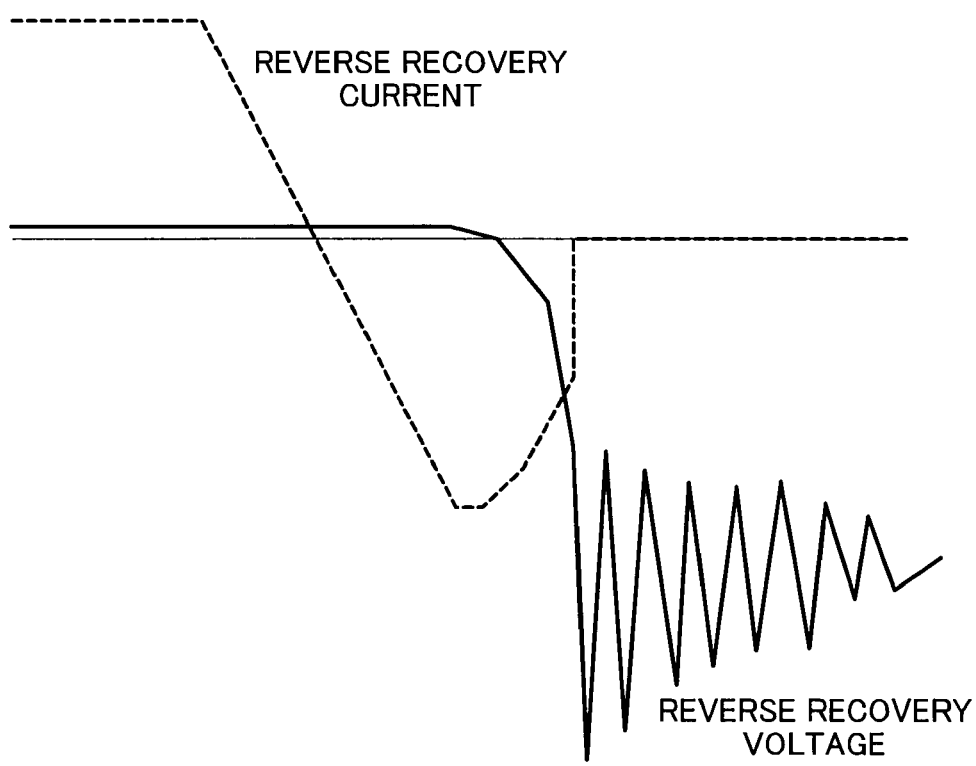
FIG. 31 is a waveform view showing current and voltage waveforms when the semiconductor device according to the comparative example of the fifth embodiment is turned off.

An off-operation of the semiconductor device 5 configured as described above will be described while referring to a comparative example. FIG. 29 is a cross-sectional view typically showing a configuration of a semiconductor device according to the comparative example of the fifth embodiment. The right part of FIG. 29 is a graph showing carrier concentrations during an on-operation and an off-operation and a field intensity during the off-operation of the semiconductor device 5-c in association with the configuration of the semiconductor device 5-c. Similar constituent elements of the semiconductor device 5-c according to the comparative example to those according to the fifth embodiment are assigned with the same reference symbols and the description thereof will be omitted. The semiconductor device 5-c according to the comparative example shown in FIG. 29 differs from the semiconductor device 5 according to the fifth embodiment in that no n+ type diffusion regions 31 nor p+ type diffusion regions 32 are provided in an n− type semiconductor region 28. FIGS. 30 and 31 are waveform views showing waveforms of reverse recovery currents and reverse recovery voltages when the semiconductor devices 5 and 5-c according to the fifth embodiment and the comparative example are turned off, respectively.

In the semiconductor device 5-c according to the comparative example, the carrier concentration of carriers (electrons or holes) accumulated in the n− type semiconductor region 28 during electrical conduction is shown as ON in the graph in the right part of FIG. 29. After the semiconductor device 5-c is turned off, carriers decrease from both the n type emitter region 27 side and the p type emitter region 29 side of the n− type semiconductor region 28 to follow a reverse recovery operation. A change in the carrier concentration during this operation is shown as OFF-1 to OFF-5 in the graph in the right part of FIG. 29. Field intensities of the electric field spreading in the n− type semiconductor region 28 during this operation are shown as OFF-1 to OFF-5 in the graph in the right part of FIG. 29.

As the field generated in the n− type semiconductor region 28 spreads, carriers are emitted from the n− type semiconductor region 28. After the carrier concentration OFF-5, when the carriers remaining in the n− type semiconductor region 28 are completely emitted, an electric field at an intensity equal to or higher than a certain intensity reaches the n type emitter region 27 as shown as OFF-6 in the graph of the field intensity, and the flow of a reverse recovery current suddenly stops. As a voltage V appearing like spikes is represented by a temporal change of a current I (V=Ls(dI/dt), where Ls is a parasitic inductance of a circuit), noise is disadvantageously generated to a reverse recovery voltage due to a sudden change of the current (see FIG. 31).

In a PiN diode, it suffices to make the n− type semiconductor region 28 thinner so as to lessen loss during electrical conduction and to improve characteristics during a reverse recovery operation. However, if the n− type semiconductor region 28 is made thinner, oscillation occurs to the waveform and noise is generated as shown in FIG. 31. Since this noise may cause malfunction of other electric devices, influence communication or the like and influence a control system for devices or the like, it is desired to reduce the noise.

The carrier concentration of carriers (electrons or holes) accumulated in the n− type semiconductor region 28 in the semiconductor device 5 according to the fifth embodiment during electrical conduction is shown as ON in the graph in the right part of FIG. 28. After the semiconductor device 5 is turned off, the carriers decrease from both the n type emitter region 27 side and the p type emitter region 29 side of the n− type semiconductor region 28. A change in the carrier concentration during this operation is shown as OFF-1 to OFF-6 in the graph in the right part of FIG. 28. Field intensities of the electric field spreading in the n− type semiconductor region 28 during this operation are shown as OFF-1 to OFF-4 in the graph in the right part of FIG. 28.

In the semiconductor device 5 according to this embodiment, after the electric field at field intensity equal to or higher than the certain intensity spreads to the n+ type diffusion regions 31 and the p+ type diffusion regions 32 as shown as OFF-4, the n+ type diffusion regions 31 and the p+ type diffusion regions 32 stop extension of the field. Since the carriers remaining between each n+ type diffusion region 31 and each p+ type diffusion region 32 are emitted gradually, flow of the reverse recovery current does not stop suddenly. Accordingly, a voltage V represented by a temporal change of the current I (V=Ls (dI/dt), where Ls is the parasitic inductance of the circuit) does not cause noise because of the gentle change of the current (see FIG. 30). As described above, the semiconductor device 5 according to this embodiment can prevent generation of noise during the off-operation.

The n+ type diffusion regions 31 are provided closer to a surface of the lower electrode 26 than to the center of the n− type semiconductor region 28. Due to this, a depletion layer tends to spread during application of high voltage, thus facilitating increasing a breakdown voltage. If a high breakdown voltage is required in particular, the p+ type diffusion regions 32 are arranged to be either proximate to or in contact with the n type emitter region 27 and the n+ type diffusion regions 31 are arranged to be away from the surface of the n type emitter region 27 by a distance equal to or smaller than one-fifth of the thickness of the n− type semiconductor region 28. That is, it is preferable to design the diode so that the depletion layer contacts with the n+ type diffusion regions 31 just when a DC voltage of an inverter (a capacitor voltage) is applied to the diode in terms of cosmic ray tolerance. By so designing, the electric field of the main junction side can be suppressed to be low during application of the DC voltage from the inverter.

The embodiments of the present invention have been described so far. However, the present invention is not limited to these embodiments but various modifications, additions and the like can be made of the present invention within a range without departing from the spirit of the present invention. For example, the embodiments have been described while assuming that the first conductivity type is the n type and that the second conductivity type is the p type. Alternatively, the present invention can be carried out by defining that the first conductivity type is the p type and the second conductivity type is the n type.

Figure 32:
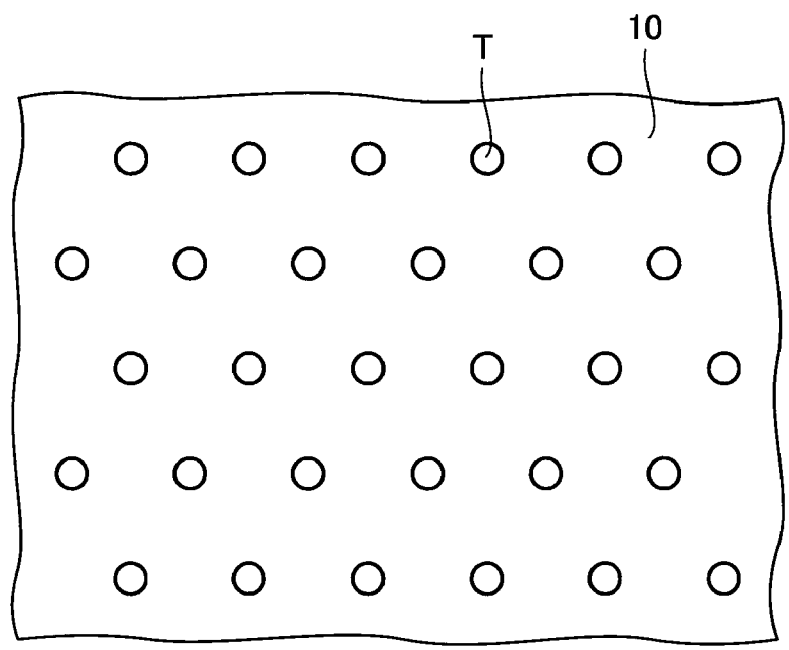
FIG. 32 is a plan view showing an example of a shape of trenches formed in a semiconductor substrate.
Figure 33:
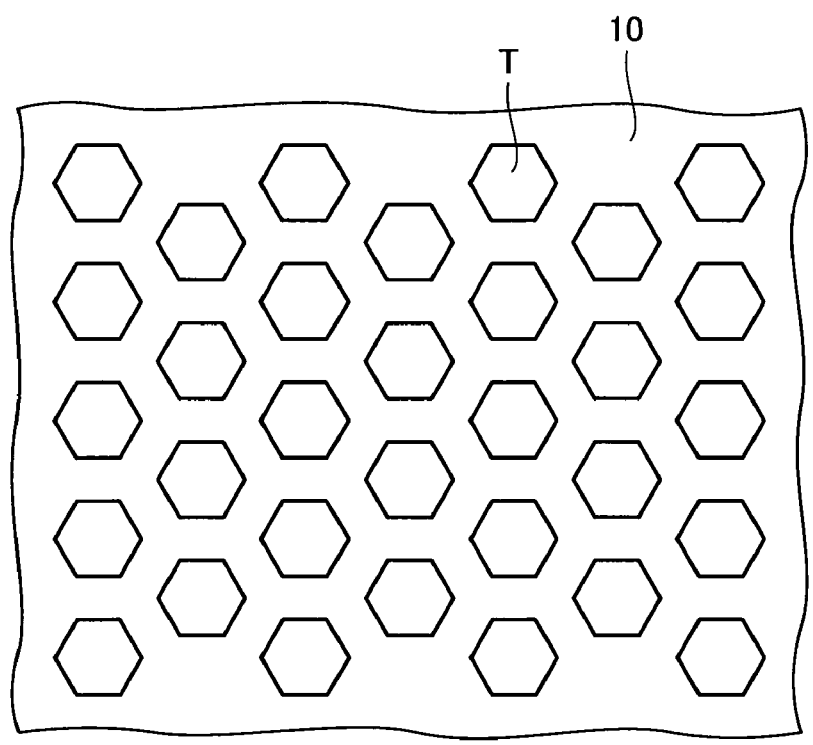
FIG. 33 is a plan view showing an example of a shape of trenches formed in the semiconductor substrate.
Figure 34:
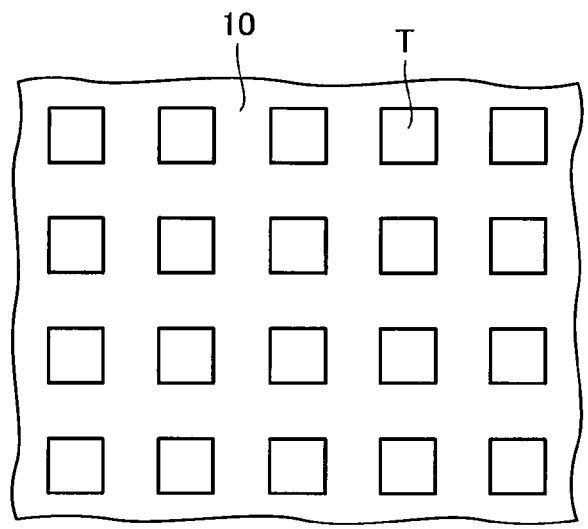
FIG. 34 is a plan view showing an example of a shape of trenches formed in the semiconductor substrate.
Figure 35:
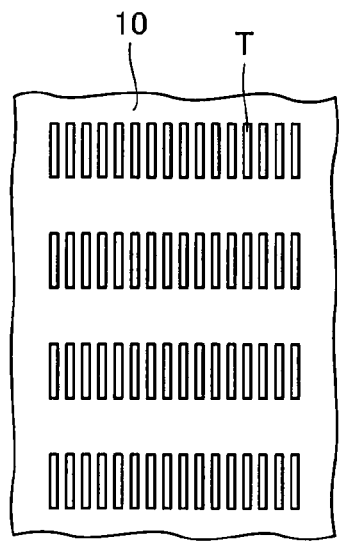
FIG. 35 is a plan view showing an example of a shape of trenches formed in the semiconductor substrate.
Figure 36:
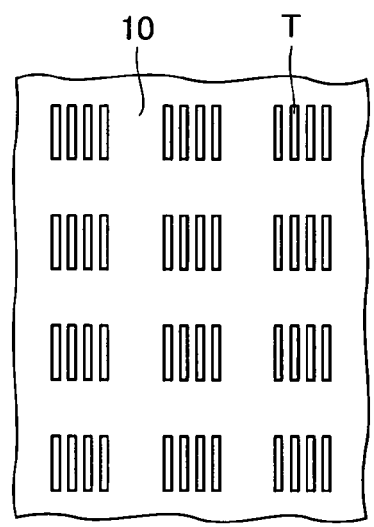
FIG. 36 is a plan view showing an example of a shape of trenches formed in the semiconductor substrate.

Moreover, in the embodiments of the present invention, the trenches T formed in the semiconductor substrate have stripe shapes extending in the direction perpendicular to the sheets in the drawings. Alternatively, as shown in plan views of the semiconductor substrate 10 in FIGS. 32 to 34, each of these trenches T can be cylindrical, hexagonal or lattice-shaped. By so forming the trenches T, wafer warpage can be reduced even if the heat treatment or the like is conducted in the process of manufacturing the semiconductor device. Further, by partially providing portions where no trenches T are formed as shown in plan views of the semiconductor substrate 10 in FIGS. 35 and 36, even if the trenches T are formed into stripes, the wafer warpage can be reduced in the process of manufacturing the semiconductor device.

In the embodiments described above, the semiconductor device is the trench gate IGBT. Alternatively, the semiconductor device may be a planar gate IGBT. Further, the present invention can be carried out while being combined with various structures of the terminal region such as providing a guard ring region in the terminal region, providing a field plate electrode therein, and the like.

Moreover, in the embodiments described above, a semiconductor material of the IGBT is silicon. Alternatively, as the semiconductor material, a compound semiconductor such as silicon carbide (SiC) or gallium nitride (GaN) or a wide-band gap semiconductor such as diamond can be used. Furthermore, in the embodiments, the semiconductor device is the IGBT. Alternatively, any semiconductor device such as a MOSFET, an SBD (Schottky Barrier Diode), a device of a combination of the MOSFET and the SBD or an SIT (Static Induction Transistor) can also be used as the semiconductor device according to the present invention.

What is claimed is:

1. A semiconductor device comprising:
   a semiconductor substrate having an upper surface and a lower surface opposed to each other;
   a first base region of a first conductivity type provided in the semiconductor substrate;
   a buffer region of the first conductivity type provided on a lower surface of the first base region and having an impurity concentration higher than an impurity concentration of the first base region;
   an emitter region of a second conductivity type provided on a lower surface of the buffer region;
   a second base region of the second conductivity type selectively provided on an upper surface of the first base region;
   a diffusion region of the first conductivity type selectively provided on an upper surface of the second base region;
   a control electrode provided in a region ranging from the diffusion region to the first base region via the second base region, with an insulating film therearound;
   a first main electrode provided to be electrically connected to the second base region and the diffusion region; and
   a second main electrode provided to be electrically connected to a lower surface of the emitter region,
   a junction interface between the buffer region and the first base region having a concave portion and a convex portion.

2. The semiconductor device according to claim 1, wherein an impurity concentration distribution of the buffer region is a distribution in which the impurity concentration periodically changes in a first direction along the semiconductor substrate at the same depth of the buffer region.

3. The semiconductor device according to claim 1, wherein an impurity concentration distribution of the buffer region is a distribution in which a peak of the impurity concentration is formed at a position corresponding to a peak of the convex portion of the buffer region, the convex portion being included in the concave portion and the convex portion provided in the junction interface between the buffer region and the first base region, the peak of the convex portion of the buffer region being at the same depth of the buffer region.

4. The semiconductor device according to claim 1, wherein the concave portion and the convex portion provided in the junction interface between the buffer region and the first base region are formed into a stripe shape extending in a second direction along the semiconductor substrate.

5. The semiconductor device according to claim 1, wherein a junction interface between the buffer region and the emitter region has a concave portion and a convex portion.

6. The semiconductor device according to claim 5, wherein the concave portion and the convex portion of the junction interface between the buffer region and the emitter region are formed such that a convex portion of the emitter region is formed at a position substantially identical to a position in which a convex portion of the buffer region is formed, the convex portion of the buffer region being included in the concave portion and the convex portion provided on the junction interface between the buffer region and the first base region.

7. The semiconductor device according to claim 5, wherein the concave portion and the convex portion provided in the junction interface between the buffer region and the emitter region are formed into a stripe shape extending in a second direction along the semiconductor substrate.

8. The semiconductor device according to claim 1, further comprising:
   an element region provided in the semiconductor substrate, a semiconductor element being formed in the element region by connecting the diffusion region to the first main electrode; and
   a terminal region provided to surround a peripheral portion of the element region, the semiconductor element not being formed in the terminal region,
   wherein the concave portion and the convex portion of the junction interface between the buffer region and the first base region are provided in the element region.

9. The semiconductor device according to claim 8, wherein the buffer region and the emitter region are formed selectively only in the element region.

10. The semiconductor device according to claim 8, wherein a junction interface between the buffer region and the emitter region has a concave portion and a convex portion.

11. The semiconductor device according to claim 8, wherein the buffer region is formed to extend to the terminal region.

12. The semiconductor device according to claim 1, wherein the control electrode is a trench gate control electrode provided in a trench formed in the semiconductor substrate via an insulating film.

13. The semiconductor device according to claim 1, wherein the semiconductor device is an insulated gate bipolar transistor (IGBT).

* * * * *